(12) United States Patent
Yokoyama

(10) Patent No.: US 7,999,339 B2
(45) Date of Patent: Aug. 16, 2011

(54) PHOTOELECTRIC CONVERSION DEVICE AND SOLID-STATE IMAGING DEVICE

(75) Inventor: Daisuke Yokoyama, Ashigarakami-gun (JP)

(73) Assignee: Fujifilm Corporation, Tokyo (JP)

( * ) Notice: Subject to any disclaimer, the term of this patent is extended or adjusted under 35 U.S.C. 154(b) by 54 days.

(21) Appl. No.: 11/703,656

(22) Filed: Feb. 8, 2007

(65) Prior Publication Data

US 2007/0194400 A1    Aug. 23, 2007

(30) Foreign Application Priority Data

Feb. 22, 2006   (JP) .............................. P 2006-045955

(51) Int. Cl.
*H01L 27/14* (2006.01)
(52) U.S. Cl. ............ 257/431; 257/E31.003; 257/31.095
(58) Field of Classification Search .................. 438/431
See application file for complete search history.

(56) References Cited

U.S. PATENT DOCUMENTS

| | | | |
|---|---|---|---|
| 5,142,343 A * | 8/1992 | Hosokawa et al. ........... | 257/103 |
| 5,965,875 A | 10/1999 | Merrill | |
| 6,534,759 B1 * | 3/2003 | Koscielniak et al. ...... | 250/214.1 |
| 6,632,701 B2 | 10/2003 | Merrill | |
| 6,838,743 B2 * | 1/2005 | Yamada et al. ............... | 257/461 |
| 7,309,531 B2 * | 12/2007 | Suzuki et al. ................. | 428/690 |
| 7,492,028 B2 * | 2/2009 | Nishi et al. ................... | 257/458 |
| 2001/0013898 A1 * | 8/2001 | Bawolek et al. ............. | 348/272 |
| 2003/0209651 A1 | 11/2003 | Iwasaki | |
| 2004/0016983 A1 * | 1/2004 | Misawa ........................ | 257/433 |
| 2004/0085598 A1 | 5/2004 | Kokeguchi et al. | |
| 2004/0121087 A1 * | 6/2004 | Sakata et al. .................... | 428/1.1 |
| 2004/0135502 A1 * | 7/2004 | Kobayashi et al. ........... | 313/506 |
| 2004/0166362 A1 * | 8/2004 | Utsumi et al. ................ | 428/690 |
| 2004/0232830 A1 * | 11/2004 | Hieda ............................ | 313/504 |
| 2004/0253413 A1 * | 12/2004 | Baba et al. .................... | 428/141 |
| 2005/0029513 A1 * | 2/2005 | Kawashima et al. ........... | 257/40 |
| 2005/0205903 A1 | 9/2005 | Hioki | |
| 2005/0205958 A1 | 9/2005 | Taniguchi et al. | |
| 2006/0049745 A1 * | 3/2006 | Handa et al. .................. | 313/503 |
| 2006/0088698 A1 * | 4/2006 | Majumdar et al. ......... | 428/195.1 |
| 2006/0278944 A1 * | 12/2006 | Rand et al. .................... | 257/431 |
| 2007/0228503 A1 * | 10/2007 | Yokoyama .................... | 257/431 |

FOREIGN PATENT DOCUMENTS

JP          7-38136 A        2/1995

(Continued)

OTHER PUBLICATIONS

Tokito et al, "High temperature operation of an electroluminescent device fabricated using a novel triphenylamine derivative", Jun. 19, 1996, Applied Physics Letters, vol. 19, Issue 7, p. 878-880.*

(Continued)

*Primary Examiner* — Charles D Garber
*Assistant Examiner* — Pape Sene
(74) *Attorney, Agent, or Firm* — Sughrue Mion, PLLC

(57) ABSTRACT

A photoelectric conversion device comprising a photoelectric conversion part including a first electrode, a second electrode opposing to the first electrode and a photoelectric conversion layer provided between the first electrode and the second electrode, wherein a smoothing layer for reducing roughness of a surface of the photoelectric conversion layer is provided between the first electrode or the second electrode and the photoelectric conversion layer.

27 Claims, 17 Drawing Sheets

FOREIGN PATENT DOCUMENTS

| | | |
|---|---|---|
| JP | 9-012548 A | 1/1997 |
| JP | 10-218887 A | 8/1998 |
| JP | 2003-258293 A | 9/2003 |
| JP | 2003-332551 | 11/2003 |
| JP | 2004-134933 A | 4/2004 |
| JP | 2004-165242 A | 6/2004 |
| JP | 2005-268609 A | 9/2005 |
| JP | 2005-303266 A | 10/2005 |
| JP | 2005-340489 A | 12/2005 |
| JP | 2006-032088 A | 2/2006 |

OTHER PUBLICATIONS

Tanaka et al, "Novel hole-transporting material based on triphenylamine for organic electrolminescent devices", 1996, Royal Society of Chemistry, No. 18, p. 2175-2176.*

Japanese Office Action dated May 10, 2011, issued in corresponding Application No. 2006-045955.

* cited by examiner

PHOTOELECTRIC CONVERSION DEVICE AND SOLID-STATE IMAGING DEVICE

FIELD OF THE INVENTION

The present invention relates to a photoelectric conversion device including a photoelectric conversion part containing a first electrode, a second electrode opposing to the first electrode and a photoelectric conversion layer formed between the first electrode and the second electrode.

BACKGROUND OF THE INVENTION

Conventional devices for optical sensing have a photodiode (PD) in a semiconductor substrate such as silicon (Si) generally. As a solid-state imaging device, there is widely employed a planar solid-state imaging device in which PDs are two-dimensionally arranged in a semiconductor substrate and a signal corresponding to signal charges generated from each PD by photoelectric conversion is read out by a CCD or CMOS circuit. As a method of realizing a color solid-state imaging device, a general structure has color filters each of which is able to transmit only light having a specified wavelength therethrough and arranged for the color separation in a side of the light incident face of a planar solid-state imaging device. In particular, as a system which is widely employed at present for digital cameras and so on, there is well known a single-plate solid-state imaging device in which color filters which are able to transmit blue (B) light, green (G) light and red (R) light, respectively therethrough are regularly arranged on respective two-dimensionally arranged PDs.

However, in the single-plate solid-state imaging device, since the color filter transmits only light of a limited wavelength therethrough, light which has not transmitted through the color filter is not utilized, resulting in the loss of the light use efficiency. Also, with progress of high integration of pixel, the size of PD becomes the same in size as the wavelength of visible light, whereby the light is hardly guided into PD. Also, since blue light, green light and red light are detected by separate PDs adjacent to each other and then subjected to arithmetic processing, thereby achieving color reproduction, a false color may possibly be generated. In order to avoid this false color, an optical low-pass filter is necessary, resulting in the generation of an optical loss by this filter.

There have hitherto been reported color sensors in which three PDs are stacked within a silicon substrate by utilizing the wavelength dependency of an absorption coefficient of silicon and color separation is carried out due to a difference in depth on the p-n junction of each PD (see U.S. Pat. No. 5,965,875, U.S. Pat. No. 6,632,701 and JP-A-7-38136). However, such a system involves a problem that the wavelength dependency of spectral sensitivity in the stacked PDs is so broad that the color separation is insufficient. In particular, the color separation between blue and green colors is insufficient.

In order to solve this problem, there is proposed a sensor with a photoelectric conversion part on the upper side of a silicon substrate. A photoelectric conversion part detects green light and generates a signal charge corresponding thereto and blue light and red light are detected by two PDs stacked within the silicon substrate (see JP-A-2003-332551). The photoelectric conversion part on the upper side of the silicon substrate is configured to include a first electrode stacked on the silicon substrate, a photoelectric conversion layer which is made of an organic material stacked on the first electrode and a second electrode stacked on the photoelectric conversion layer. This photoelectric conversion part is configured such that when a voltage is applied between the first electrode and the second electrode, a signal charge generated within the photoelectric conversion layer transfers into the first electrode and the second electrode and a signal corresponding to the signal charge transferred into either one of the electrode layers is read out by a CCD or CMOS circuit provided within the silicon substrate or the like. In this specification, the "photoelectric conversion layer" as referred to herein means a layer capable of absorbing incident light having a specified wavelength and generating charges (electrons and holes) corresponding to the quantity of absorbed light.

SUMMARY OF THE INVENTION

In the case where an organic photoelectric conversion layer is stacked on the upper side of a PD within a silicon substrate, it is required to use an electrode having high optical transparency as a first electrode and a second electrode for sandwiching an organic photoelectric conversion material therebetween. A transparent conductive oxide is suitable, and an ITO (Sn-doped indium oxide) electrode or the like is enumerated from the viewpoints of processing suitability and smoothness. However, since such a transparent conductive oxide is in general formed by a sputtering method, a critical problem occurs. In the case of fabricating a photoelectric conversion part by forming a first electrode on a substrate, forming a photoelectric conversion layer thereon and subsequently forming a second electrode thereon, sputtered particles enter into the depressed areas of a surface of the photoelectric conversion layer which has already been formed when the second electrode is formed, whereby the device is liable to short out. In particular, in the case of using a polycrystalline layer with large roughness made of a pigment based material or the like as the photoelectric conversion layer, this phenomenon becomes remarkable. The "polycrystalline layer" as referred to herein is a layer in which fine crystals having a different crystal orientation from each other in the same material are gathered. A relatively large number of irregularities are present on the surface thereof as compared with a single crystalline material or an amorphous material. Furthermore, since the second electrode is formed by a sputtering method, the photoelectric conversion layer is liable to be damaged due to plasma at the time of sputtering, and device characteristics are liable to be deteriorated. In addition, sputtered particles enter into the depressed area of a surface of the photoelectric conversion layer, whereby roughness of a surface of the second electrode becomes large. When the large roughness is present on the surface of the second electrode, a uniform electric field cannot be applied within the photoelectric conversion layer when a bias voltage is applied to the photoelectric conversion layer, and a region where a high electric field is locally generated is formed, resulting in causing an increase of leak current.

Under such circumstances, the invention has been made. An object of the invention is to provide a photoelectric conversion device including a photoelectric conversion part containing a first electrode, a second electrode opposing to the first electrode and a photoelectric conversion layer formed between the first electrode and the second electrode, and being less in deterioration of device characteristics when the electrode is fabricated. Another object of the invention is to provide a solid-state imaging device which is less in pixel failure by using the subject photoelectric conversion device.

(1) A photoelectric conversion device including a photoelectric conversion part containing a first electrode, a second electrode opposing to the first electrode and a photoelectric conversion layer formed between the first electrode and the second electrode, wherein a smoothing layer for reducing roughness of a surface of the photoelectric conversion layer is provided between the first electrode or the second electrode and the photoelectric conversion layer.

(2) The photoelectric conversion device as set forth in (1), wherein the smoothing layer is composed of an amorphous material.

(3) The photoelectric conversion device as set forth in (1) or (2), wherein the photoelectric conversion layer is composed of an organicpolycrystalline material.

(4) The photoelectric conversion device as set forth in (3), wherein the organic material contains a material of a quinacridone skeleton.

(5) The photoelectric conversion device as set forth in any one of (1) to (4), wherein a surface of the smoothing layer has a mean surface roughness Ra of not more than 1 nm.

(6) The photoelectric conversion device as set forth in any one of (1) to (5), wherein the smoothing layer comprises an organic material.

(7) The photoelectric conversion device as set forth in any one of (1) to (6), wherein the smoothing layer is transparent.

(8) The photoelectric conversion device as set forth in any one of (1) to (7), wherein the smoothing layer has a thickness of from 10 to 300 nm.

(9) The photoelectric conversion device as set forth in any one of (1) to (8), wherein the second electrode is an electrode in a light incident side, the smoothing layer is provided between the second electrode and the photoelectric conversion layer, and the first electrode is an electrode for collecting electrons, and the second electrode is an electrode for collecting holes.

(10) The photoelectric conversion device as set forth in (9), wherein the smoothing layer is composed of a hole transporting material.

(11) The photoelectric conversion device as set forth in (10), wherein the hole transporting material is a material having a triphenylamine structure.

(12) The photoelectric conversion device as set forth in (11), wherein the hole transporting material is a material having a starburst amine structure.

(13) The photoelectric conversion device as set forth in any one of (9) to (12), wherein the first electrode has a work function of not more than 4.5 eV.

(14) The photoelectric conversion device as set forth in any one of (9) to (12), wherein the first electrode is ITO, and a layer of In formed between the ITO and the photoelectric conversion layer is provided.

(15) The photoelectric conversion device as set forth in any one of (1) to (8), wherein the second electrode is an electrode in a light incident side, the smoothing layer is provided between the second electrode and the photoelectric conversion layer, and the first electrode is an electrode for collecting holes, and the second electrode is an electrode for collecting electrons.

(16) The photoelectric conversion device as set forth in (15), wherein the smoothing layer is composed of an electron transporting material.

(17) The photoelectric conversion device as set forth in (16), wherein the electron transporting material is Alq3 or a derivative thereof.

(18) The photoelectric conversion device as set forth in any one of (15) to (17), wherein the second electrode has a work function of not more than 4.5 eV.

(19) The photoelectric conversion device as set forth in (18), wherein the second electrode is Cs-doped ITO.

(20) The photoelectric conversion device as set forth in any one of (1) to (13) or any one of (15) to (18), wherein at least one of the first electrode and the second electrode is a transparent electrode.

(21) The photoelectric conversion device as set forth in (20), wherein both the first electrode and the second electrode are a transparent electrode.

(22) The photoelectric conversion device as set forth in (20) or (21), wherein the transparent electrode is a thin layer made of a transparent conductive oxide.

(23) The photoelectric conversion device as set forth in (22), wherein the transparent conductive oxide is ITO.

(24) The photoelectric conversion device as set forth in (20) or (21), wherein the transparent electrode is a thin layer made of a metal formed by vapor deposition.

(25) The photoelectric conversion device as set forth in any one of (1) to (24), wherein the first electrode and the second electrode each has a thickness of from 5 to 200 nm.

(26) The photoelectric conversion device as set forth in any one of (1) to (25), which is provided with a semiconductor substrate having at least one of the photoelectric conversion part stacked on the upper side thereof, a charge storage part in the semiconductor substrate for storing a charge generated in the photoelectric conversion layer in the photoelectric conversion part, and a connecting part for electrically connecting the first electrode or the second electrode of the photoelectric conversion part to the charge storage part.

(27) The photoelectric conversion device as set forth in (26), further comprising a photoelectric conversion part in the semiconductor substrate for absorbing light which has transmitted through the photoelectric conversion layer in the photoelectric conversion part, generating a charge corresponding to the light and storing it.

(28) The photoelectric conversion device as set forth in (27), wherein the photoelectric conversion part in the semiconductor substrate is made of plural photodiodes stacked within the semiconductor substrate for absorbing light of a different color, respectively.

(29) The photoelectric conversion device as set forth in (27), wherein the photoelectric conversion part in the semiconductor substrate is made of plural photodiodes within the semiconductor substrate for absorbing light of a different color, respectively, as arranged in a direction vertical to a direction of the incident light within the semiconductor substrate.

(30) The photoelectric conversion device as set forth in (28) or (29), wherein one of the photoelectric conversion part is stacked on the upper side of the semiconductor substrate, the plural photodiodes are a photodiode having a p-n junction formed in a suitable position for absorbing blue light and a photodiode having a p-n junction formed in a suitable position for absorbing red light, and the photoelectric conversion layer in the photoelectric conversion part absorbs green light.

(31) A solid-state imaging device including a number of the photoelectric conversion device as set forth in any one of (26) to (30), as disposed in an array state, wherein a signal read-out part for reading out a signal corresponding to the charge stored in each of the plural photoelectric conversion devices is provided.

According to the invention, it is possible to provide a photoelectric conversion device including a photoelectric conversion part containing a first electrode, a second electrode opposing to the first electrode and a photoelectric conversion layer formed between the first electrode and the second electrode, and being less in deterioration of device characteristics when the electrode is fabricated. Also, it is possible to provide a solid-state imaging device which is less in pixel failure by using the subject photoelectric conversion device.

Figure 1:
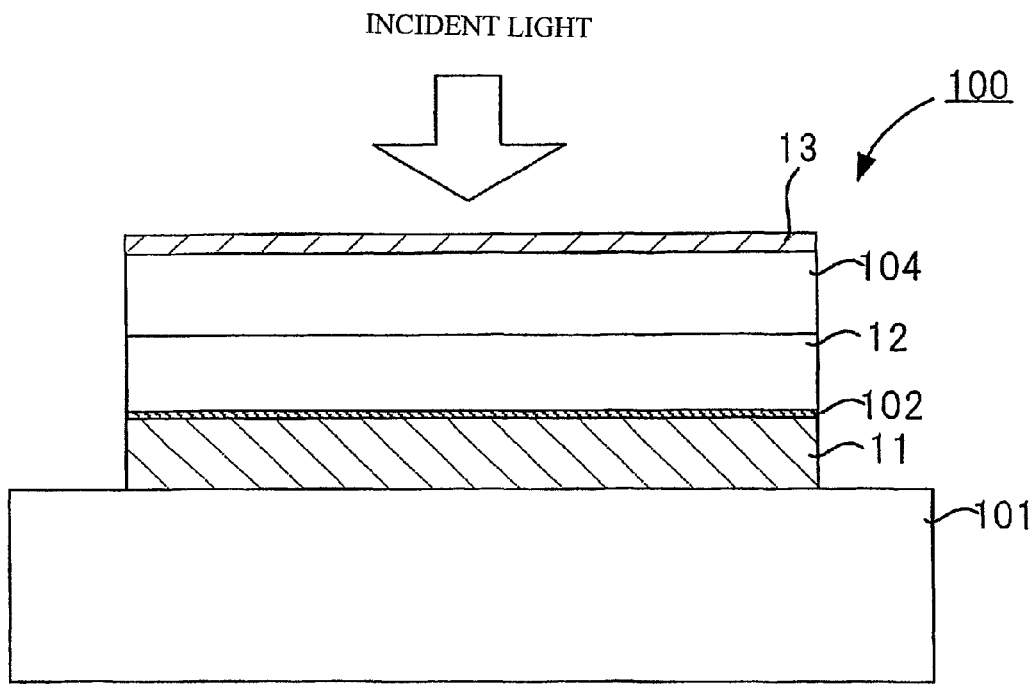
FIG. 1 is a schematic cross-sectional view to show an outline configuration of a photoelectric conversion device for explaining an embodiment of the invention.

DESCRIPTION OF REFERENCE NUMERALS AND SIGNS 11 first electrode
12 photoelectric conversion layer
13 second electrode
100 photoelectric conversion device
101 glass substrate
102 work function adjusting layer
104 smoothing layer

DETAILED DESCRIPTION OF THE INVENTION

Embodiments of the invention will be hereunder described with reference to the accompanying drawings.

FIG. 1 is a schematic cross-sectional view to show an outline configuration of a photoelectric conversion device for explaining an embodiment of the invention.

A photoelectric conversion device 100 as illustrated in FIG. 1 has a photoelectric conversion part including a first electrode 11 formed on a glass substrate 101; a work function adjusting layer 102 for adjusting a work function of the first electrode 11, which is formed on the first electrode 11; a photoelectric conversion layer 12 formed on the work function adjusting layer 102; a smoothing layer 104 for reducing roughness of a surface of the photoelectric conversion layer 12, which is formed on the photoelectric conversion layer 12; and a second electrode 13 formed on the smoothing layer 104.

Since the photoelectric conversion device 100 as illustrated in FIG. 1 is fabricated for receiving incident light from the upper side of the second electrode 13, the second electrode 13 is in the incident side of light. Furthermore, in the photoelectric conversion device 100 as illustrated in FIG. 1, a bias voltage is applied between the first electrode 11 and the second electrode 13 such that charges generate in the photoelectric conversion layer 12 and holes are transferred into the second electrode 13, whereas electrons are transferred into the first electrode 11. The photoelectric conversion device 100 as illustrated in FIG. 1 can be used by two ways inclusive of a first method of collecting electrons generated in the photoelectric conversion layer 12 to obtain a signal; and a second method of collecting holes generated in the photoelectric conversion layer 12 to obtain a signal.

The first electrode 11 is an electron collecting electrode for collecting electrons generated in the photoelectric conversion layer 12. As described later, there may be the case where the photoelectric conversion device 100 is also required to transmit light downwardly therethrough. For that reason, it is preferable that the first electrode 11 is a transparent electrode with high transparency. The term "transparent" as referred to herein means that 80% or more of light of a visible region (from about 420 nm to about 660 nm) is transmitted as a whole. As the transparent electrode, a thin layer of a transparent conductive oxide is suitable; and it is especially preferred to use ITO from the viewpoints of processing suitability and smoothness. It is also possible to realize a transparent electrode by depositing a metal thinly to a degree such that visible light can be transmitted therethrough. A thickness of the first electrode 11 is preferably from 5 to 200 nm. By controlling a bias voltage, the first electrode 11 can also work as a hole collecting electrode for collecting holes generated in the photoelectric conversion layer 12. Examples of a material of the first electrode 11 which can be used include ITO, IZO, AZO, $ZnO_2$, $SnO_2$, $TiO_2$, FTO, Al, Ag, and Au.

The second electrode 13 is a hole collecting electrode for collecting holes generated in the photoelectric conversion layer 12. Since the second electrode 13 is also required to transmit light downwardly therethrough, it is preferable that the second electrode 13 is a transparent electrode similar to the first electrode 11. A thickness of the second electrode 13 is preferably from 5 to 200 nm. By controlling a bias voltage, the second electrode 13 can also work as an electron collecting electrode for collecting electrons generated in the photoelectric conversion layer 12. Examples of a material of the second electrode 13 which can be used include ITO, IZO, AZO, $ZnO_2$, $SnO_2$, $TiO_2$, FTO, Al, Ag, and Au.

The photoelectric conversion layer 12 may be of either a single-layered structure or a multilayered structure and is constituted of an organic semiconductor material or an material containing organic dye or an inorganic material each having a sensitivity to light of a specified wavelength. An organic material is preferable from the viewpoint of wavelength selectivity; and a highly crystalline organic material is more preferable because of its high photoelectric conversion performance. As one example thereof, a material having a quinacridone (5,12-dihdyroquino[2,3-b]acridine-7,14-dione, hereinafter referred to as "QA") skeleton can be preferably used. A chemical formula of the quinacridone is shown below.

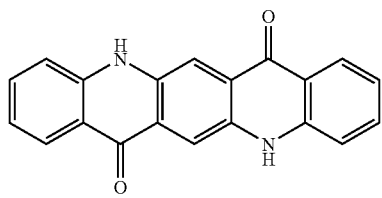

As the smoothing layer 104, any organic material or inorganic material can be used so far as it has a small roughness of a surface thereof and does not cause a short circuit of the photoelectric conversion layer 12. In particular, an amorphous material is preferably used because it does not have large roughness of its surface. Since light must enter into the photoelectric conversion layer 12, it is preferable that the smoothing layer 104 is transparent. A thickness of the smoothing layer 104 is preferably in the range of from 10 to 300 nm. For reducing roughness effectively, the thickness of the smoothing layer 104 is especially preferably 30 nm or more. When the thickness of the smoothing layer 104 is too thick, a bias voltage to be applied to the photoelectric conversion layer 12 becomes large. Therefore, the thickness of the smoothing layer 104 is preferably not more than 200 nm.

In the photoelectric conversion device 100 as illustrated in FIG. 1, the second electrode 13 works as a hole collecting electrode. For that reason, it is preferable that a material constituting the smoothing layer 104 is a hole transporting material. Examples of the hole transporting material which is suitable for the smoothing layer 104 include triphenylamine based organic materials having a triphenylamine structure. In addition, examples of the triphenylamine based organic material having a starburst amine structure in which triphenylamine structures are connected to each other in a star-like state. The "starburst amine structure" as referred to herein means a structure of TDATA represented by the following chemical formula (4). As the triphenylamine based organic material, a material represented by the following chemical formula (3) (hereinafter referred to as "Amine A") and so on can be used. In addition, as the starburst amine based organic material, m-MTDATA (4,4',4''-tris(3-methylphenylphenylamino)triphenylamine) represented by the following chemical formula (2) and so on can be used.

Chemical Formula (2)

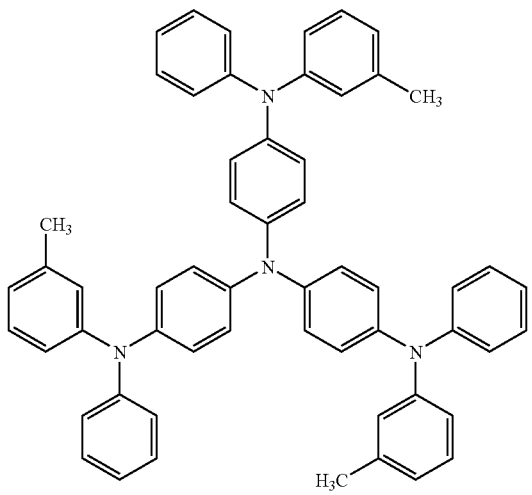

Chemical Formula (3)

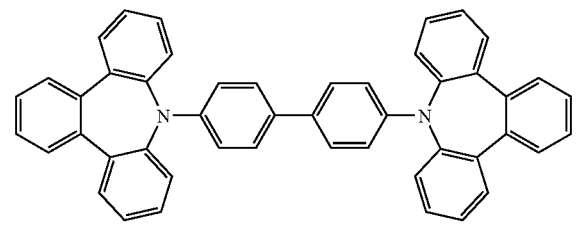

Chemical Formula (4)

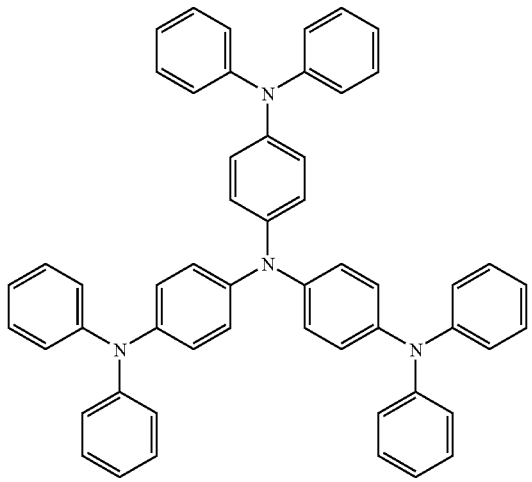

Incidentally, in the case where the second electrode 13 works an electron collecting electrode and the first electrode 11 works a hole collecting electrode, a material constituting the smoothing layer 104 is preferably an electron transporting material. Alq3 (tris(8-hydroxyquinolinato)aluminum(III)) represented by the following chemical formula (5) or a derivative thereof can be used as the electron transporting material which is suitable for the smoothing layer 104.

Chemical Formula (5)

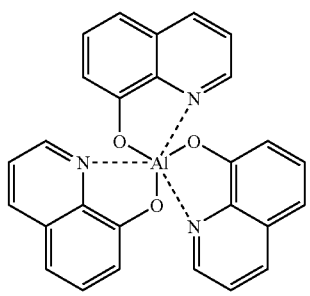

By providing this smoothing layer 104, even in the case of forming the second electrode 13 by a sputtering method, it becomes possible to prevent sputtered particles from entering into the depressed area of the surface of the photoelectric conversion layer 12. Also, it becomes possible to prevent the photoelectric conversion layer 12 from being exposed to plasma by covered by the smoothing layer 104. Also, since the second electrode 13 is formed on the smooth surface 104, the second electrode 13 can be made flat, and a uniform electric field can be applied to the photoelectric conversion layer 12. In this way, by providing the smoothing layer 104, it becomes possible to prevent the photoelectric conversion device 100 from the deterioration in performance when an electrode is fabricated. Incidentally, in the case where the photoelectric conversion layer 12 is a polycrystalline layer, large roughness of the surface of the photoelectric conversion layer 12 is remarkably observed. For that reason, in such a configuration, it is especially effective to provide the smoothing layer 104. The smoothing layer 104 may also be constituted of a photoelectric conversion material by itself. Examples of an organic material constituting the polycrystalline layer include the foregoing quinacridone.

Next, a work function adjusting layer 102 will be described. Incidentally, the work function adjusting layer is described in detail in Japanese Patent Application No. 2005-251745.

In a photoelectric conversion device having a structure that a photoelectric conversion layer, quinacridone for example, is interposed between two upper and lower transparent electrodes, in the case where a transparent electrode with high transparency such as ITO is used especially as the electrode in the side of collecting electrons, a dark current is considerably large as approximately 10 μA/cm² when bias voltage of 1 V is applied on it.

It is thought that one of the causes of the generation of a dark current resides in a current which flows into the photoelectric conversion layer from the electron collecting electrode when bias voltage is applied. In the case where an electrode with high transparency such as an ITO transparent electrode is used as the electrode in the side of collecting electrons, it is thought that since its work function is relatively high, the barrier of the hole injection into the photoelectric conversion layer from the electron collecting electrode becomes low, whereby the hole injection into the photoelectric conversion layer is easy to occur. Actually, in examining the work function of a metal oxide based transparent electrode with high transparency such as ITO, for example, it is known that an ITO electrode has a work function of approximately 4.8 eV, a value of which is considerably high as compared with a work function of an Al (aluminum) electrode which is approximately 4.3 eV; and that transparent electrodes of a metal oxide other than ITO have a relatively high work function as from about 4.6 to 5.4 eV exclusive of AZO (Al-doped zinc oxide) having the smallest work function as approximately 4.5 eV (see, for example, FIG. 12 of *J. Vac. Sci. Technol.*, A17(4), July/August 1999, pages 1765 to 1772).

As above, when the work function of the electron collecting electrode is high, the barrier of the hole injection into the photoelectric conversion layer from the electron collecting electrode is low, and the hole injection into the photoelectric conversion layer from the electron collecting electrode is easy to occur. As a result, it is thought that the dark current becomes large.

Then, in the photoelectric conversion device 100 as illustrated in FIG. 1, the first electrode 11 as an electron collecting electrode is adjusted so as to have a work function of not more than 4.5 eV. Examples of a method of adjusting the work function of the first electrode 11 at not more than 4.5 eV will be given below.

(A) As illustrated in FIG. 1, the work function adjusting layer 102 for adjusting the work function of the first electrode 11 is provided between the first electrode 11 and the photoelectric conversion layer 12.

For example, ITO is used as the first electrode 11, and a thin metal layer containing In, Ag or Mg and having a work function of not more than 4.5 eV is used as the work function adjusting layer 102.

(B) A conductive transparent metal oxide thin layer having a work function of not more than 4.5 eV is used as the first electrode 11.

For example, an AZO thin layer having a work function of 4.5 eV is used as the conductive transparent metal oxide thin layer.

(C) A transparent electrode resulting from doping on a metal oxide to have a work function of not more than 4.5 eV is used as the first electrode 11.

For example, an electrode resulting from doping Cs on ITO as the conductive metal oxide to have a work function of not more than 4.5 eV is used.

(D) An electrode resulting from a surface treatment of a conductive transparent metal oxide thin layer to have a work function of not more than 4.5 eV is used as the first electrode 11.

For example, an electrode resulting from a surface treatment of ITO as the conductive transparent metal oxide thin layer by immersing it in an alkaline solution is used as the first electrode 11. Alternatively, an electrode resulting from a surface treatment of ITO as the conductive transparent metal oxide thin layer by sputtering it with Ar ions or Ne ions is used.

Incidentally, in the case where the second electrode 13 works as an electron collecting electrode, the second electrode 13 may be adjusted so as to have a work function of not more than 4.5 eV. Examples of a method of adjusting the work function of the second electrode 13 at not more than 4.5 eV include the following (E) and the foregoing (B) to (D) in which, however, the first electrode 11 is changed to the second electrode 13.

(E) In FIG. 1, a work function adjusting layer for adjusting a work function of the second electrode 13 is provided between the second electrode 13 and the smoothing layer 104, and the work function adjusting layer 102 between the first electrode 11 and the photoelectric conversion layer 12 is eliminated. For example, ITO is used as the second electrode 13, and a thin metal layer containing In, Ag or Mg and having a work function of not more than 4.5 eV is used as the work function adjusting layer.

Examples of documents regarding the adjustment of a work function of a transparent electrode made of ITO will be given below.

TABLE 1

Examples of documents regarding the adjustment of work function of ITO electrode (non-patent documents)

| Document | Authors | Method | Change in work function | Evaluation method | Factor of change |
|---|---|---|---|---|---|
| Applied Physics Letters, 74, 880 (1999) | F. Nuesch, et al. | After $O_2$ (Ar) plasma treatment, acid or alkali treatment | 5.1 eV at maximum by acid treatment or 3.9 eV at minimum by alkali treatment | Ultraviolet photoelectron spectroscopy | Formation of electric double layer as caused due to $H^+/OH^-$ adsorption on the surface |
| Synthetic Metals, 96, 77 (1998) | T. Osada, et al. | After solvent washing and $H_2O_2$ treatment, $Ne^+$ sputtering | 4.8 eV by $H_2O_2$ treatment and 4.0 eV by $Ne^+$ sputtering | Ultraviolet photoelectron spectroscopy | Reduction of O ratio of the surface by $Ne^+$ sputtering |
| Journal of Applied Physics, 87, 295 (2000) | K. Sugiyama, et al. | UV ozone treatment or $Ar^+$ sputtering | 4.75 eV by UV ozone treatment or 4.3 eV by $Ar^+$ sputtering | Ultraviolet photoelectron spectroscopy | Elimination of C contamination by UV ozone or reduction of O ratio by $Ar^+$ sputtering |
| Applied Surface Science, 218, 258 (2003) | J. A. Chaney, et al. | $O_2$ plasma treatment or alkali treatment | 5.3 eV by $O_2$ plasma treatment or 4.5 eV alkali treatment | Oscillation capacity method (Kelvin method) | Formation of electric double layer as caused due to $OH^-$ adsorption |
| Japanese Journal of Applied Physics, 44, 5939 (2005) | T. Uchida, et al. | Mixing of Cs vapor in Ar gas for sputtering at the time of ITO film formation | 4.1 eV at minimum by mixing of Cs vapor | Atmospheric photoelectron spectroscopy | Doping of Cs into ITO |

Furthermore, metals having a work function of not more than 4.5 eV will be enumerated below along with characteristics thereof.

(Photoelectric Conversion Layer)

The organic material constituting the photoelectric conversion layer 12 is able to absorb light and achieve photoelectric

TABLE 2

Characteristics of metal having a low work function (excluding alkali metals)

| | Work function (eV) | Melting point (° C.) | Boiling point (° C.) | Bulk resistivity ($\Omega$cm) | Reaction with air or water |
|---|---|---|---|---|---|
| Ag | 4.2 | ○: 950 | ○: 2210 | ○: $1.5 \times 10^{-6}$ | ○: Inert |
| Al | 4.3 | ○: 660 | ○: 2470 | ○: $2.5 \times 10^{-6}$ | Δ: Oxide layer formed |
| Ba | 2.5 | ○: 730 | ○: 1640 | Δ: $4.6 \times 10^{-5}$ | X: Oxidized and soluble in water |
| Bi | 4.2 | ○: 270 | ○: 1610 | X: $1.1 \times 10^{-4}$ | ○: Inert |
| Ca | 2.9 | ○: 840 | ○: 1480 | ○: $3.2 \times 10^{-6}$ | X: Oxidized and soluble in water |
| Eu | 2.5 | ○: 820 | ○: 1600 | Δ: $9.0 \times 10^{-5}$ | X: Oxidized and soluble in water |
| Ga | 2.6 | X: 28 | ○: 2400 | Δ: $1.4 \times 10^{-5}$ | ○: Inert |
| Hf | 3.9 | ○: 2230 | Δ: 5200 | Δ: $3.5 \times 10^{-5}$ | Δ: Oxide layer formed |
| In | 4.1 | ○: 160 | ○: 2080 | ○: $8.0 \times 10^{-6}$ | ○: Inert |
| La | 3.5 | ○: 920 | ○: 3460 | ○: $5.7 \times 10^{-6}$ | X: Oxidized and soluble in water |
| Lu | 3.3 | ○: 1660 | ○: 3400 | Δ: $7.9 \times 10^{-5}$ | X: Oxidized and soluble in water |
| Mg | 3.7 | ○: 650 | ○: 1090 | ○: $3.9 \times 10^{-6}$ | X: Oxidized |
| Mn | 4.1 | ○: 1240 | ○: 1960 | X: $2.6 \times 10^{-4}$ | X: Oxidized and soluble in water |
| Nb | 4.3 | ○: 2470 | Δ: 4740 | Δ: $1.3 \times 10^{-5}$ | Δ: Oxide layer formed |
| Nd | 3.2 | ○: 1020 | ○: 3070 | Δ: $6.4 \times 10^{-5}$ | X: Soluble in water |
| Pb | 4.2 | ○: 330 | ○: 1740 | Δ: $1.9 \times 10^{-5}$ | X: Oxidized |
| Sc | 3.5 | ○: 1540 | ○: 2830 | Δ: $6.1 \times 10^{-5}$ | X: Oxidized and soluble in water |
| Sm | 2.7 | ○: 1080 | ○: 1790 | Δ: $8.8 \times 10^{-5}$ | X: Soluble in water |
| Sn | 4.5 | ○: 230 | ○: 2270 | Δ: $9.4 \times 10^{-5}$ | ○: Inert |
| Ta | 4.3 | ○: 3000 | Δ: 5430 | Δ: $1.2 \times 10^{-5}$ | ○: Inert |
| Tb | 3.0 | ○: 1360 | ○: 3120 | | X: Oxidized and soluble in water |
| Th | 3.4 | ○: 1750 | Δ: 4790 | Δ: $1.3 \times 10^{-5}$ | X: ignited |
| Ti | 4.3 | ○: 1660 | ○: 3290 | Δ: $5.8 \times 10^{-5}$ | ○: Inert |
| V | 4.3 | ○: 1890 | ○: 3377 | Δ: $2.5 \times 10^{-5}$ | ○: Inert |
| W | 4.4 | ○: 3410 | Δ: 5660 | ○: $4.9 \times 10^{-6}$ | ○: Inert |
| Y | 3.1 | ○: 1520 | Δ: 3340 | Δ: $5.7 \times 10^{-5}$ | X: Oxidized |
| Zn | 4.3 | ○: 420 | Δ: 910 | ○: $5.5 \times 10^{-6}$ | X: Oxidized |
| Zr | 4.1 | ○: 1850 | Δ: 4380 | Δ: $4.0 \times 10^{-5}$ | Δ: Oxide layer formed |

| | Material | Viewpoint |
|---|---|---|
| Preferable | Ag, Al, Ca, In, Mg | The resistance is small; the melting point is not excessively low; the boiling point is not excessively high; and the metal is relatively cheap. |
| Especially preferable | Ag, In, Mg | The transparency is high. |
| Most preferable | Ag, In | The reactivity is low. | conversion. Usually, the organic material constituting the photoelectric conversion layer 12 is able to absorb a part of visible light (light in a wavelength region of from 420 nm to 660 nm) and preferably has an absorptance of a peak wavelength in that wavelength region of 50% or more. It is preferable that the organic material constituting the photoelectric conversion layer 12 contains at least one of an organic p-type semiconductor and an organic n-type semiconductor.

The organic p-type semiconductor (compound) is an organic semiconductor (compound) having donor properties and refers to an organic compound which is mainly represented by a hole transporting organic compound and which has properties such that it is liable to donate an electron. In more detail, the organic p-type semiconductor refers to an organic compound having a smaller ionization potential in two organic compounds when they are brought into contact with each other and used. Accordingly, with respect to the organic compound having donor properties, any organic compound can be used so far as it is an electron donating organic compound. Useful examples thereof include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (for example, naphthalene derivatives, anthracene derivatives, phenanthrene derivatives, tetracene derivatives, pyrene derivatives, perylene derivatives, and fluoranthene derivatives), and metal complexes having, as a ligand, a nitrogen-containing heterocyclic compound. Incidentally, the invention is not limited to these compounds, and as described previously, an organic compound having a smaller ionization potential than that of an organic compound to be used as an n-type compound (having acceptor properties) may be used as the organic semiconductor having donor properties.

The organic n-type semiconductor (compound) is an organic semiconductor (compound) having acceptor properties and refers to an organic compound which is mainly represented by an electron transporting organic compound and which has properties such that it is liable to accept an electron. In more detail, the organic n-type semiconductor refers to an organic compound having a larger electron affinity in two organic compounds when they are brought into contact with each other and used. Accordingly, with respect to the organic compound having acceptor properties, any organic compound can be used so far as it is an electron accepting organic compound. Useful examples thereof include fused aromatic carbocyclic compounds (for example, naphthalene derivatives, anthracene derivatives, phenanthroline derivatives, tetracene deriveatives, pyrene derivatives, perylene derivatives, and fluoranthene derivatives), 5- to 7-membered heterocyclic compounds containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, and tribenzazepine), polyarylene compounds, fluorene compounds, cyclopentadiene compounds, silyl compounds, and metal complexes having, as a ligand, a nitrogen-containing heterocyclic compound. Incidentally, the invention is not limited to these compounds, and as described previously, an organic compound having a larger electron affinity than that of an organic compound to be used as an organic compound having donor properties may be used as the organic semiconductor having acceptor properties.

Though any organic dye is useful as the p-type organic dye or n-type organic dye, preferred examples thereof include cyanine dyes, styryl dyes, hemicyanine dyes, merocyanine dyes (inclusive of zeromethinemerocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic compounds (for example, naphthalene derivatives, anthracene derivatives, phenanthrene derivatives, tetracene derivatives, pyrene derivatives, perylene derivatives, and fluoranthene derivatives).

Next, the metal complex compound will be described. The metal complex compound is a metal complex having a ligand containing at least one of a nitrogen atom, an oxygen atom and a sulfur atom as coordinated to a metal. Though a metal ion in the metal complex is not particularly limited, it is preferably a beryllium ion, a magnesium ion, an aluminum ion, a gallium ion, a zinc ion, an indium ion, or a tin ion; more preferably a beryllium ion, an aluminum ion, a gallium ion, or a zinc ion; and further preferably an aluminum ion or a zinc ion. As the ligand which is contained in the metal complex, there are enumerated various known ligands. Examples thereof include ligands as described in H. Yersin, *Photochemistry and Photophysics of Coordination Compounds*, Springer-Verlag, 1987; and Akio Yamamoto, *Organometallic Chemistry—Principles and Applications*, Shokabo Publishing Co., Ltd., 1982.

The foregoing ligand is preferably a nitrogen-containing heterocyclic ligand (having preferably from 1 to 30 carbon atoms, more preferably from 2 to 20 carbon atoms, and especially preferably from 3 to 15 carbon atoms, which may be a monodentate ligand or a bidentate or polydentate ligand, with a bidentate ligand being preferable; and examples of which include a pyridine ligand, a bipyridyl ligand, a quinolinol ligand, and a hydroxyphenylazole ligand (for example, a hydroxyphenylbenzimidazole ligand, a hydroxyphenylbenzoxazole ligand, and a hydroxyphenylimidazole ligand), an alkoxy ligand (having preferably from 1 to 30 carbon atoms, more preferably from 1 to 20 carbon atoms, and especially preferably from 1 to 10 carbon atoms, examples of which include methoxy, ethoxy, butoxy, and 2-ethylhexyloxy), an aryloxy ligand (having preferably from 6 to 30 carbon atoms, more preferably from 6 to 20 carbon atoms, and especially preferably from 6 to 12 carbon atoms, examples of which include phenyloxy, 1-naphthyloxy, 2-naphthyloxy, 2,4,6-trimethylphenyloxy, and 4-biphenyloxy), a heteroaryloxy ligand (having preferably from 1 to 30 carbon atoms, more preferably from 1 to 20 carbon atoms, and especially preferably from 1 to 12 carbon atoms, examples of which include pyridyloxy, pyrazyloxy, pyrimidyloxy, and quinolyloxy), an alkylthio ligand (having preferably from 1 to 30 carbon atoms, more preferably from 1 to 20 carbon atoms, and especially preferably from 1 to 12 carbon atoms, examples of which include methylthio and ethylthio), an arylthio ligand (having preferably from 6 to 30 carbon atoms, more preferably from 6 to 20 carbon atoms, and especially preferably from 6 to 12 carbon atoms, examples of which include phenylthio), a heterocyclic substituted thio ligand (having preferably from 1 to 30 carbon atoms, more preferably from 1 to 20 carbon atoms, and especially preferably from 1 to 12 carbon atoms, examples of which include pyridylthio, 2-benzimidazolylthio, 2-benzoxazolylthio, and 2-benzothiazolylthio), or a siloxy ligand (having preferably from 1 to 30 carbon atoms, more preferably from 3 to 25 carbon atoms, and especially preferably from 6 to 20 carbon atoms, examples of which include a triphenyloxy group, a triethoxysiloxy group, and a triisopropylsiloxy group); more preferably a nitrogen-containing heterocyclic ligand, an aryloxy ligand, a heteroaryloxy ligand, or a siloxy ligand; and further preferably a nitrogen-containing heterocyclic ligand, an aryloxy ligand, or a siloxy ligand.

The case where the photoelectric conversion layer 12 contains a photoelectric conversion layer having a p-type semiconductor layer and an n-type semiconductor layer, with at least one of the p-type semiconductor layer and the n-type semiconductor layer being an organic semiconductor, and a bulk heterojunction structure layer containing the p-type semiconductor and the n-type semiconductor as an interlayer between these semiconductor layers is preferable. In such case, by containing a bulk heterojunction structure in the photoelectric conversion layer 12, it is possible to compensate a drawback that the photoelectric conversion layer 12 has a short carrier diffusion length and improve the photoelectric conversion efficiency. Incidentally, the bulk heterojunction structure is described in detail in Japanese Patent Application No. 2004-080639.

Furthermore, the case where the photoelectric conversion layer 12 having a structure having two or more of a repeating structure (tandem structure) of a pn junction layer formed of the p-type semiconductor layer and the n-type semiconductor layer is preferable; and the case where a thin layer made of a conducting material is inserted between the foregoing repeating structures is more preferable. The number of the repeating structure (tandem structure) of a pn junction layer is not limited. For enhancing the photoelectric conversion efficiency, the number of the repeating structure (tandem structure) of a pn junction layer is preferably from 2 to 50, more preferably from 2 to 30, and especially preferably from 2 to 10. The conducting material is preferably silver or gold, and most preferably silver. Incidentally, the tandem structure is described in detail in Japanese Patent Application No. 2004-079930.

Furthermore, the case where the photoelectric conversion layer 12 has a layer of a p-type semiconductor and a layer of an n-type semiconductor (preferably a mixed or dispersed (bulk heterojunction structure) layer) and contains an orientation-controlled organic compound in at least one of the p-type semiconductor and the n-type semiconductor is preferable; and the case where the photoelectric conversion layer 12 which contains an orientation-controlled (orientation controllable) organic compound in both the p-type semiconductor and the n-type semiconductor is more preferable. As this organic compound, an organic compound having a π-conjugated electron is preferably used. It is preferable that this π-electron plane is not vertical to a substrate (electrode substrate) but is oriented at an angle close to parallel to the substrate as far as possible. The angle against the substrate is preferably 0° or more and not more than 80°, more preferably 0° or more and not more than 60°, further preferably 0° or more and not more than 40°, still further preferably 0° or more and not more than 20°, especially preferably 0° or more and not more than 10°, and most preferably 0° (namely, in parallel to the substrate). As described previously, it is only required that even a part of the layer of the orientation-controlled organic compound is contained over the whole of the photoelectric conversion layer 12. A proportion of the orientation-controlled portion to the whole of the photoelectric conversion layer 12 is preferably 10% or more, more preferably 30% or more, further preferably 50% or more, still further preferably 70% or more, especially preferably 90% or more, and most preferably 100%. By controlling the orientation of the organic compound which is contained in the photoelectric conversion layer 12, the foregoing state compensates a drawback that the photoelectric conversion layer 12 has a short carrier diffusion length, thereby improving the photoelectric conversion efficiency.

In the case where the orientation of an organic compound is controlled, it is more preferable that the heterojunction plane (for example, a pn junction plane) is not in parallel to a substrate. In this case, it is preferable that the heterojunction plane is not in parallel to the substrate (electrode substrate) but is oriented at an angle close to verticality to the substrate as far as position. The angle to the substrate is preferably 10° or more and not more than 90°, more preferably 30° or more and not more than 90°, further preferably 50° or more and not more than 90°, still further preferably 70° or more and not more than 90°, especially preferably 80° or more and not more than 90°, and most preferably 90° (namely, vertical to the substrate). As described previously, it is only required that even a part of the layer of the heterojunction plane-controlled organic compound is contained over the whole of the photoelectric conversion layer 12. A proportion of the orientation-controlled portion to the whole of the photoelectric conversion layer 12 is preferably 10% or more, more preferably 30% or more, further preferably 50% or more, still further preferably 70% or more, especially preferably 90% or more, and most preferably 100%. In such case, the area of the heterojunction plane in the photoelectric conversion layer 12 increases and the amount of a carrier such as an electron, a hole and a pair of an electron and a hole as formed on the interface increases so that it is possible to improve the photoelectric conversion efficiency. In the light of the above, in the photoelectric conversion layer in which the orientation of the organic compound on both the heterojunction plane and the π-electron plane is controlled, it is possible to improve especially the photoelectric conversion efficiency. These states are described in detail in Japanese Patent Application No. 2004-079931. From the standpoint of optical absorption, it is preferable that the thickness of the organic dye layer is thick as far as possible. However, taking into consideration a proportion which does not contribute to the charge separation, the thickness of the organic dye layer is preferably 30 nm or more and not more than 300 nm, more preferably 50 nm or more and not more than 250 nm, and especially preferably 80 nm or more and not more than 200 nm.

The photoelectric conversion layer 12 containing such an organic compound is fabricated by a dry deposition method or a wet deposition method. Specific examples of the dry deposition method include physical vapor phase epitaxy methods such as a vacuum vapor deposition method, a sputtering method, an ion plating method, and an MBE method; and CVD methods such as plasma polymerization. Examples of the wet deposition method include a casting method, a spin coating method, a dipping method, and an LB method.

In the case of using a high molecular weight compound in at least one of the p-type semiconductor (compound) and the n-type semiconductor (compound), it is preferable to be fabricated by a wet deposition method which is easy for the preparation. In the case of employing a dry deposition method such as vapor deposition, the use of a high molecular weight compound is difficult because of possible occurrence of decomposition. Accordingly, its oligomer can be preferably used as a replacement thereof. On the other hand, in the case of using a low molecular weight compound, a dry deposition method is preferably employed, and a vacuum vapor deposition method is especially preferably employed. In the vacuum vapor deposition method, a method for heating a compound such as a resistance heating vapor deposition method and an electron beam heating vapor deposition method, the shape of a vapor deposition source such as a crucible and a boat, a degree of vacuum, a vapor deposition temperature, a substrate temperature, a vapor deposition rate, and the like are a basic parameter. In order to make it possible to achieve uniform vapor deposition, it is preferable that the vapor deposition is carried out while rotating the substrate. A high degree of vacuum is preferable. The vacuum vapor deposition is carried out at a degree of vacuum of not more than $10^{-4}$ Torr, preferably not more than $10^{-6}$ Torr, and especially preferably not more than $10^{-8}$ Torr. It is preferable that all steps at the time of vapor deposition are carried out in vacuo. Basically, the vacuum vapor position is carried out in such a manner that the compound does not come into direct contact with the external oxygen and moisture. The foregoing conditions of the vacuum vapor deposition must be strictly controlled because they affect crystallinity, amorphous properties, density, compactness, and so on. It is preferably employed to subject the vapor deposition rate to PI or PID control using a layer thickness monitor such as a quartz oscillator and an interferometer. In the case of vapor depositing two or more kinds of compounds at the same time, a dual-source vapor deposition method, a flash vapor deposition method and so on can be preferably employed.

Configuration examples of a solid-state imaging device using a photoelectric conversion device having the configuration as illustrated in FIG. 1 as the foregoing photoelectric conversion device will be hereunder described.

FIRST CONFIGURATION EXAMPLE

Figure 2:
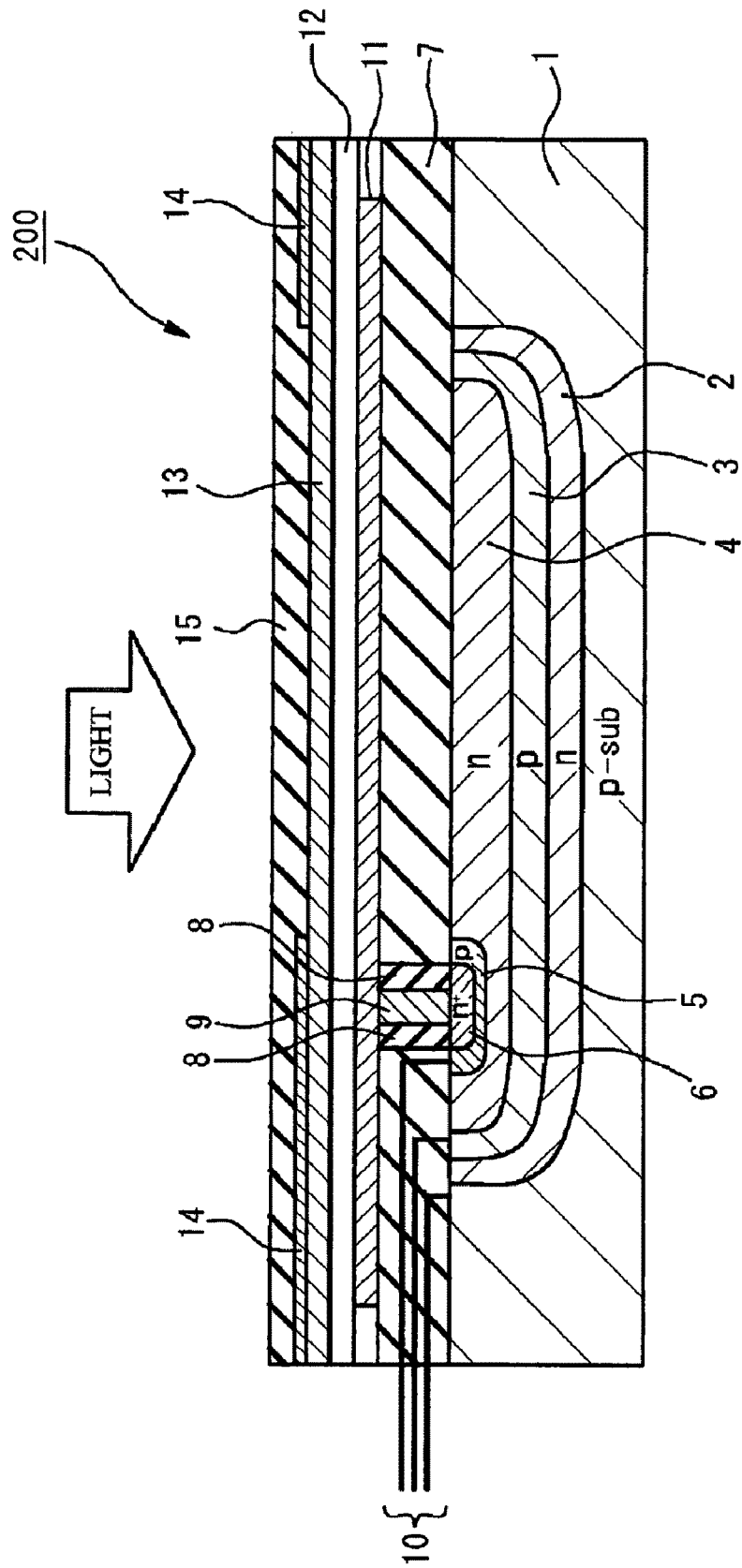
FIG. 2 is a schematic cross-sectional view of one pixel of a solid-state imaging device using a photoelectric conversion device of the configuration as illustrated in FIG. 1 and is a view to show a first configuration example.

FIG. 2 is a sectional schematic view of a portion of one pixel of a solid-state imaging device using a photoelectric conversion device of the configuration as illustrated in FIG. 1 and is a view to show a first configuration example. In this solid-state imaging device 200, the one pixel as illustrated in FIG. 2 is disposed in a plural number in an array state on the same plane, and one pixel data of image data can be produced by a signal as obtained from this one pixel.

One pixel of the solid-state imaging device as illustrated in FIG. 2 is configured to have the photoelectric conversion part as illustrated in FIG. 1 and two photodiodes formed on a silicon substrate in a lower part of this photoelectric conversion part. In FIG. 2, symbols the same as in FIG. 1 are given the same symbols. Furthermore, the work function adjusting layer 102 and the smoothing layer 104 as illustrated in FIG. 1 are omitted from illustration.

One pixel of the solid-state imaging device as illustrated in FIG. 2 is configured to include a p-type silicon substrate 1, a transparent dielectric layer 7 formed on the p-type silicon substrate 1 and a photoelectric conversion part formed on the dielectric layer 7; and a light-shielding layer 14 is formed on the photoelectric conversion part. Furthermore, a transparent dielectric layer 15 is formed on the light-shielding layer 14 and the second electrode 13.

The first electrode 11 and the second electrode 13 are each a transparent electrode. Since the second electrode 13 can be commonly used in all pixels, it may be a layer of a single-layered configuration and is not required to be separated for every pixel.

In the configuration of FIG. 2, a material capable of absorbing green light to generate electrons and holes corresponding thereto is used for the photoelectric conversion layer 12. Since the photoelectric conversion layer 12 can be commonly used in all pixels, it may be a layer of a single-layered configuration and is not required to be separated for every pixel.

An n-type semiconductor region (hereinafter referred to as "n region") 4, a p-type semiconductor region (hereinafter referred to as "p region") 3, and an n region 2 are formed in this order from the shallow side within the p-type silicon substrate 1. In a surface part of the portion which is light shielded by the light-shielding layer 14 of the n region 4, a high-density n region (hereinafter referred to as "n+ region") 6 is formed, and the periphery of the n+ region 6 is surrounded by a p region 5.

The depth of a pn junction face between the n region 4 and the p region 3 from the surface of the p-type silicon substrate 1 is a depth for absorbing blue light (about 0.2 µm). Accordingly, the n region 4 and the p region 3 absorb blue light and generate electrons corresponding thereto, thereby forming a photodiode (B photodiode) for storing the electron. The electron generated in the B photodiode is stored in the n region 4.

The depth of a pn junction face between the n region 2 and the p-type silicon substrate 1 from the surface of the p-type silicon substrate 1 is a depth for absorbing red light (about 2 µm). Accordingly, the n region 2 and the p-type silicon substrate 1 absorb red light and generate electrons corresponding thereto, thereby forming a photodiode (R photodiode) for storing the electron. The electron generated in the R photodiode is stored in the n region 2.

The n+ region 6 is electrically connected to the first electrode 11 via a connecting part 9 formed in an opening which is opened in the dielectric layer 7 and made of a metal such as aluminum and tungsten and stores the electron which has transferred into the first electrode 11 via the connecting part 9. The connecting part 9 is electrically insulated from other parts than the first electrode 11 and the n+ region 6 by a dielectric layer 8.

The electron stored in the n region 2 is converted into a signal corresponding to the amount of a charge thereof by an MOS circuit (not illustrated) which is made of an n-channel MOS transistor formed within the p-type silicon substrate 1; the electron stored in the n region 4 is converted into a signal corresponding to the amount of a charge thereof by an MOS circuit (not illustrated) which is made of an n-channel MOS transistor formed within the p region 3; and the electron stored in the n+ region 6 is converted into a signal corresponding to the amount of a charge thereof by an MOS circuit (not illustrated) which is made of an n-channel MOS transistor formed within the p region 5, which is then outputted into the outside of the solid-state imaging device 200. These MOS circuits configure a signal read-out part as set forth in the appended claims. Each of the MOS circuits is connected to a non-illustrated signal read-out pad by a wiring 10. Incidentally, an extractor electrode is provided in each of the n region 2 and the n region 4, and when a prescribed reset potential is applied, each of the regions is depleted, and the volume of each of the pn junction parts becomes an infinitely small value. In this way, it is possible to make the volume generated on the junction face extremely small.

According to such a configuration, G light can be photoelectrically converted by the photoelectric conversion layer 12, and B light and R light can be photoelectrically converted by the B photodiode and the R photodiode in the p-type silicon substrate 1, respectively. Furthermore, since the G light is first absorbed in the upper part, the color separation between the B and G lights and between the G and R lights is excellent. This is a greatly excellent point as compared with a solid-state imaging device of a type in which three PDs are stacked within a silicon substrate and all of the BGR lights are separated within the silicon substrate. In the following description, portions for carrying out the photoelectric conversion, each of which is made of an inorganic material formed within the p-type silicon substrate 1 of the solid-state imaging device 200 (B photodiode and R photodiode), are each referred to as "inorganic layer", too.

Incidentally, it is also possible to form an inorganic photoelectric conversion part made of an inorganic material, which is able to absorb light which has transmitted through the photoelectric conversion layer 12, generating a charge corresponding to the subject light and storing the charge is provided between the p-type silicon substrate 1 and the first electrode 11 (for example, between the dielectric layer 7 and the p-type silicon substrate 1). In this case, it is only required that an MOS circuit for reading out a signal corresponding to the charge stored in a charge storage region of this inorganic photoelectric conversion part is provided within the p-type silicon substrate 1 and that the wiring 10 is connected to this MOS circuit, too.

(Inorganic Layer)

With respect to the inorganic layer, pn junction or pin junction of crystalline silicon, amorphous silicon, or a compound semiconductor such as GaAs is generally employed. In this case, since the color separation is carried out with a light penetration depth of silicon, a spectrum range to be detected in each of the stacked light receiving parts becomes broad. However, by using the photoelectric conversion layer 12 as the upper layer as illustrated in FIG. 2, namely by detecting the light which has transmitted through the photoelectric conversion layer 12 in the depth direction of silicon, the color separation is remarkably improved. In particular, when G light is detected by the photoelectric conversion layer 12 as illustrated in FIG. 2, since the light which has transmitted through the photoelectric conversion layer 12 is B light and R light, only BR lights are subjective to separation of light in the depth direction in silicon so that the color separation is improved. Even in the case where the photoelectric conversion layer 12 detects the B light or the R light, by properly selecting the depth of the pn junction face of silicon, the color separation is remarkably improved.

With respect to the configuration of the inorganic layer, npn junction or pnpn junction from the incident side of light is preferable. In particular, the pnpn junction is more preferable because by providing a p layer on the surface and increasing a potential of the surface, it is possible to trap a hole generated in the vicinity of the surface and a dark current, thereby reducing the dark current.

Incidentally, while the configuration in which one photoelectric conversion part having the configuration as illustrated in FIG. 1 is stacked in the upper part of the n-type silicon substrate 1 is illustrated in FIG. 2, it is also possible to employ a configuration in which the photoelectric conversion part having the configuration as illustrated in FIG. 1 is stacked in a plural number in the upper part of the p-type silicon substrate 1. The configuration in which the photoelectric conversion part having the configuration as illustrated in FIG. 1 is stacked in a plural number will be described in a third configuration example as described later. In such case, the light to be detected in the inorganic layer may be a single color, and preferred color separation can be achieved. Furthermore, in the case where it is intended to detect lights of four colors in one pixel of the solid-state imaging device 200, for example, there may be thought a configuration in which one color is detected in one photoelectric conversion part and the remaining three colors are detected in the inorganic layer; a configuration in which two photoelectric conversion parts are stacked, thereby detecting two colors therein and the remaining two colors are detected in the inorganic layer; and a configuration in which three photoelectric conversion parts are stacked, thereby detecting three colors therein and the remaining one color is detected in the inorganic layer. Furthermore, the solid-state imaging device 200 may be configured to detect only one color in one pixel. This case is corresponding to the configuration as illustrated in FIG. 2, except that the n region 2, the p region 3 and the n region 4 are eliminated.

The inorganic layer will be hereunder described in more detail. Preferred examples of the configuration of the inorganic layer include light receiving devices of a photoconductive type, a p-n junction type, a shotkey junction type, a PIN junction type or an MSM (metal-semiconductor-metal) type; and light receiving devices of a phototransistor type. In particular, as illustrated in FIG. 2, it is preferred to use a light receiving device in which a plural number of a first conducting type region and a second conducting type region which is a reversed conducting type to the first conducting type are alternately stacked within a single semiconductor substrate and each of the junction planes of the first conducting type and second conducting type regions is formed in a depth suitable for subjecting mainly plural lights of a different wavelength region to photoelectric conversion. The single semiconductor substrate is preferably single crystalline silicon, and the color separation can be carried out by utilizing absorption wavelength characteristics relying upon the depth direction of the silicon substrate.

As the inorganic semiconductor, InGaN based, InAlN based, InAlP based, or InGaAlP based inorganic semiconductors can also be used. The InGaN based inorganic semiconductor is an inorganic semiconductor which is adjusted so as to have a maximum absorption value within a blue wavelength range by properly changing the In-containing composition. That is, the composition becomes $In_xGa_{1-x}N$ ($0 \leq x < 1$). Such a compound semiconductor is produced by employing a metal organic chemical vapor deposition method (MOCVD method). With respect to the InAlN based nitride semiconductor using, as a raw material, Al of the Group 13 similar to Ga, it can be used as a short wavelength light receiving part similar to the InGaN based semiconductor. Furthermore, InAlP or InGaAlP which is lattice matched with a GaAs substrate can also be used.

The inorganic semiconductor may be of a buried structure. The "buried structure" as referred to herein refers to a construction in which the both ends of a short wavelength light receiving part are covered by a semiconductor different from the short wavelength light receiving part. The semiconductor for covering the both ends is preferably a semiconductor having a band gap wavelength shorter than or equal to a band gap wavelength of the short wavelength light receiving part.

SECOND CONFIGURATION EXAMPLE

In a second configuration example, the inorganic layer having the configuration as illustrated in FIG. 2 which is described in the first configuration example is prepared in such a manner that two photodiodes are not stacked within the p-type silicon substrate but that two photodiodes are arranged in a direction vertical to an incident direction of the incident light, thereby detecting lights of two colors within the p-type silicon substrate.

Figure 3:
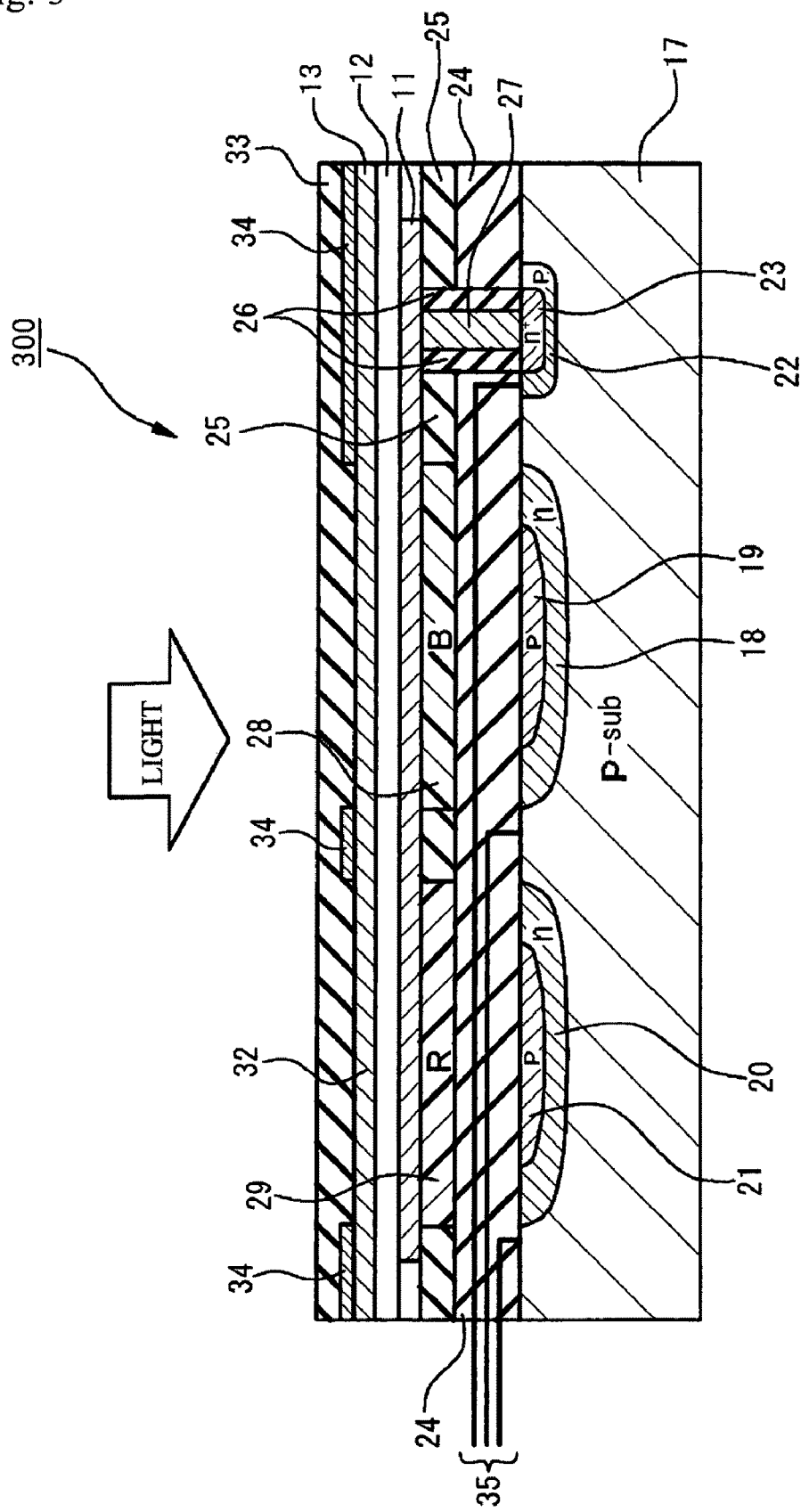
FIG. 3 is a schematic cross-sectional view of one pixel of a solid-state imaging device using the photoelectric conversion device of the configuration as illustrated in FIG. 1 and is a view to show a second configuration example.

FIG. 3 is a sectional schematic view of a portion of one pixel of a solid-state imaging device using the photoelectric conversion device having the configuration as illustrated in FIG. 1 and is a view to show a second configuration example. In FIG. 3, configurations the same as in FIG. 2 are given the same symbols.

One pixel of a solid-state imaging device 300 as illustrated in FIG. 3 is configured to include a p-type silicon substrate 17 and a photoelectric conversion part formed in an upper part of the p-type silicon substrate 17; and a light-shielding layer 34 provided with an opening is formed on the photoelectric conversion part. Furthermore, a transparent dielectric layer 33 is formed on the light-shielding layer 34.

A photodiode which is made of a p region 19 and an n region 18 and a photodiode which is made of a p region 21 and an n region 20 are formed side by side on the surface of the p-type silicon substrate 17 in a lower part of the opening of the light-shielding layer 34. An arbitrary direction on the surface of the p-type silicon substrate 17 is a direction vertical to an incident direction of the incident light.

A color filter 28 capable of transmitting B light therethrough via a transparent dielectric layer 24 is formed in an upper part of the photodiode which is made of the p region 19 and the n region 18, and the first electrode 11 is formed in an upper part thereof. A color filter 29 capable of transmitting R light therethrough via the transparent dielectric layer 24 is formed in an upper part of the photodiode which is made of the p region 21 and the n region 20, and the first electrode 11 is formed thereon. The peripheries of the color filters 28 and 29 are covered by a transparent dielectric layer 25.

The photodiode which is made of the p region 19 and the n region 18 absorbs the B light which has transmitted through the color filter 28 to generate electrons corresponding thereto and stores the generated electron in the n region 18. The photodiode which is made of the p region 21 and the n region 20 absorbs the R light which has transmitted through the color filter 29 to generate electrons corresponding thereto and stores the generated electron in the n region 20.

In a portion which is light shielded by the light-shielding layer 34 on the surface of the p-type silicon substrate 17, an n+ region 23 is formed, and the periphery of the n+ region 23 is surrounded by a p region 22.

The n+ region 23 is electrically connected to the first electrode 11 via a connecting part 27 formed in an opening which is opened in the dielectric layers 24 and 25 and made of a material such as aluminum and tungsten and stores electrons which has transferred into the first electrode 11 via the connecting part 27. The connecting part 27 is electrically insulated from other parts than the first electrode 11 and the n+ region 23 by a dielectric layer 26.

The electron stored in the n region 18 is converted into a signal corresponding to the amount of a charge thereof by an MOS circuit (not illustrated) which is made of an n-channel MOS transistor formed within the p-type silicon substrate 17; the electron stored in the n region 20 is converted into a signal corresponding to the amount of a charge thereof by an MOS circuit (not illustrated) which is made of an n-channel MOS transistor formed within the p-type silicon substrate 17; and the electron stored in the n+ region 23 is converted into a signal corresponding to the amount of a charge thereof by an MOS circuit (not illustrated) which is made of an n-channel MOS transistor formed within the p region 22, which is then outputted into the outside of the solid-state imaging device 300. These MOS circuits configure a signal read-out part as set forth in the appended claims. Each of the MOS circuits is connected to a non-illustrated signal read-out pad by a wiring 35.

Incidentally, the signal read-out part may be configured of CCD and an amplifier but not an MOS circuit. In other words, the signal read-out part may be configured such that the electrons stored in the n region 18, the n region 20 and the n+ region 23 are read out into a charge transfer channel formed within the p-type silicon substrate 17 and transferred into an amplifier, from which are then outputted signals corresponding to the electrons.

In this way, examples of the signal read-out part include CCD and CMOS structures. Of these, the CMOS structure is preferable in view of consumed electricity, high-speed read-out, pixel addition, partial read-out, and so on. Furthermore, in the case of CMOS, though any of an electron or a hole may be considered as a signal charge which can be treated, the electron is more excellent than the hole in view of high speed of signal read-out derived from a degree of charge transfer and a degree of perfection of process conditions in the manufacturing. Thus, it is preferable that the electron collecting electrode is connected to the n+ region.

Incidentally, in FIG. 3, the color separation between the R light and the B light is carried out by the color filters 28 and 29. However, the R light and the B light may be absorbed by the respective photodiodes without providing the color filters 28 and 29 by adjusting each of a depth of the pn junction face between the n region 20 and the p region 21 and a depth of the pn junction face between the n region 18 and the p region 19. In this case, it is also possible to form an inorganic photoelectric conversion part made of an organic material, which is able to absorb light which has transmitted through the photoelectric conversion layer 12, generating a charge corresponding to the subject light and storing the charge is provided between the p-type silicon substrate 17 and the first electrode 11 (for example, between the dielectric layer 24 and the p-type silicon substrate 17). In this case, it is only required that an MOS circuit for reading out a signal corresponding to the charge stored in a charge storage region of this inorganic photoelectric conversion part is provided within the p-type silicon substrate 17 and that the wiring 35 is connected to this MOS circuit, too.

Furthermore, a configuration in which one photodiode is provided within the p-type silicon substrate 17 and plural photoelectric conversion parts are stacked in the upper part of the p-type silicon substrate 17 may be employed. In addition, a configuration in which plural photodiodes are provided within the p-type silicon substrate 17 and plural photoelectric conversion parts are stacked in the upper part of the p-type silicon substrate 17 may be employed. Moreover, in the case where it is not necessary to prepare a color image, a configuration in which one photodiode is provided within the p-type silicon substrate 17 and only one photoelectric conversion part is stacked thereon may be employed.

THIRD CONFIGURATION EXAMPLE

A third configuration example is concerned with a configuration in which the inorganic layer having the configuration as illustrated in FIG. 2 which is described in the first configuration example is not provided and the photoelectric conversion layer having the configuration as illustrated in FIG. 1 is stacked in a plural number (three in this instance) in an upper part of the silicon substrate.

Figure 4:
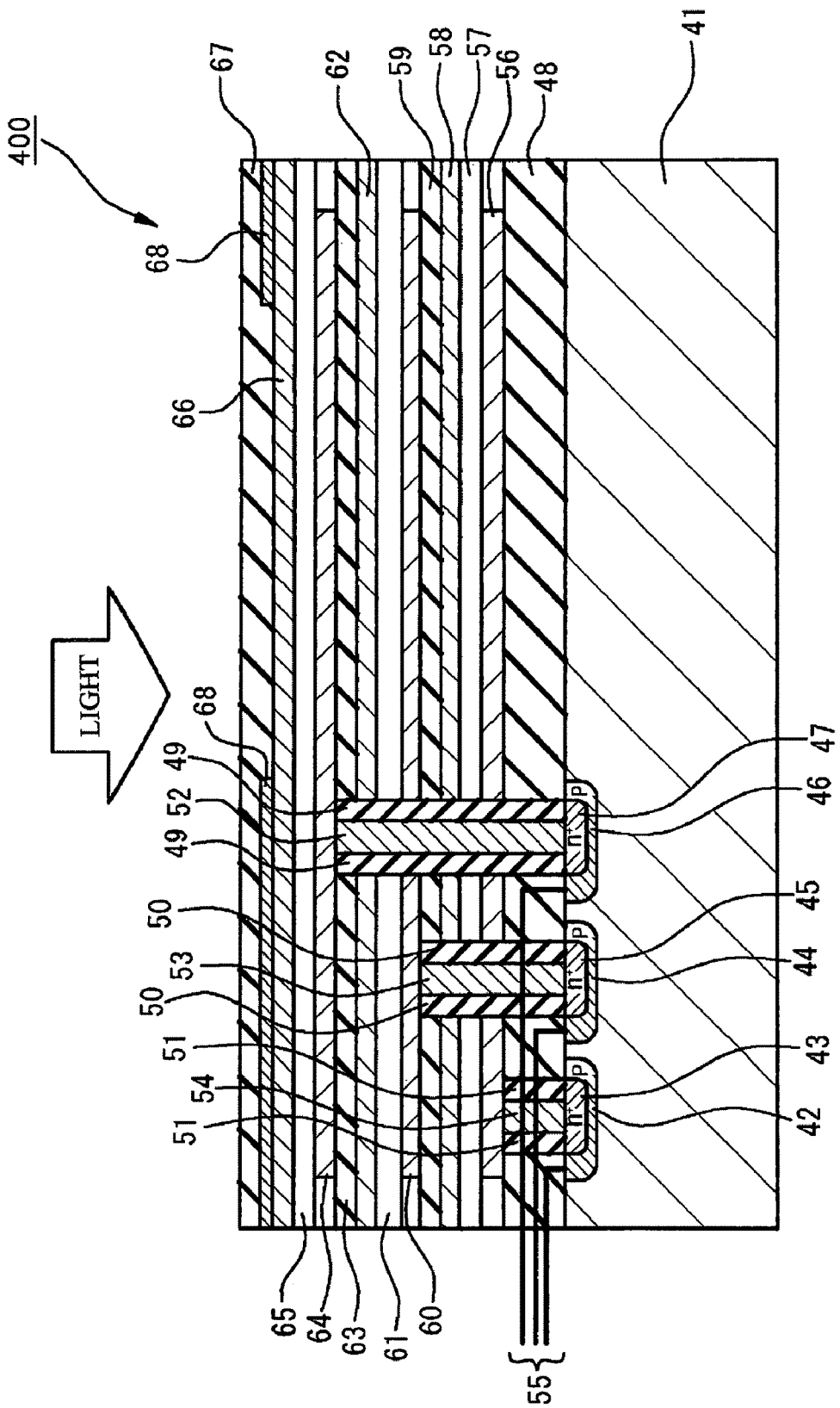
FIG. 4 is a schematic cross-sectional view of one pixel of a solid-state imaging device using the photoelectric conversion device of the configuration as illustrated in FIG. 1 and is a view to show a third configuration example.

FIG. 4 is a sectional schematic view of a portion of one pixel of a solid-state imaging device using the photoelectric conversion device having the configuration as illustrated in FIG. 1 and is a view to show a third configuration example. FIG. 4 shows a configuration example in which a photoelectric conversion part for detecting G light, a photoelectric conversion part for detecting R light and a photoelectric conversion part for detecting B light are stacked as the photoelectric conversion part. Though each of the photoelectric conversion parts has a configuration the same as the configuration as illustrated in FIG. 1, the work function adjusting layer and the smoothing layer are omitted from illustration in FIG. 4. Furthermore, in order to distinguish the respective photoelectric conversion parts, the symbols are changed from those in FIG. 1.

A solid-state imaging device 400 as illustrated in FIG. 4 is configured such that an R photoelectric conversion part including a first electrode 56, a photoelectric conversion layer 57 formed on the first electrode 56 and a second electrode 58 formed on the photoelectric conversion layer 57; a B photoelectric conversion part including a first electrode 60, a photoelectric conversion layer 61 formed on the first electrode 60 and a second electrode 62 formed on the photoelectric conversion layer 61; and a G photoelectric conversion part including a first electrode 64, a photoelectric conversion layer 65 formed on the first electrode 64 and a second electrode 66 formed on the photoelectric conversion layer 65 are stacked in this order in an upper part of a silicon substrate 41 in a state that the first electrode to be contained in each of the photoelectric conversion parts is faced in the side of the silicon substrate 41.

A transparent dielectric layer 48 is formed on the silicon substrate 41; the R photoelectric conversion part is formed thereon; a transparent dielectric layer 59 is formed thereon; the B photoelectric conversion part is formed thereon; a transparent dielectric layer 63 is formed thereon; the G photoelectric conversion part is formed thereon; a light-shielding layer 68 provided with an opening is formed thereon; and a transparent dielectric layer 67 is formed thereon.

The first electrode 64, the photoelectric conversion layer 65 and the second electrode 66 which are included in the G photoelectric conversion part have configurations the same as those in the first electrode 11, the photoelectric conversion layer 12 and the second electrode 13 as illustrated in FIG. 1. However, a material capable of absorbing green light to generate electrons and holes corresponding thereto is used for the photoelectric conversion layer 65.

The first electrode 60, the photoelectric conversion layer 61 and the second electrode 62 which are included in the B photoelectric conversion part have configurations the same as those in the first electrode 11, the photoelectric conversion layer 12 and the second electrode 13 as illustrated in FIG. 1. However, a material capable of absorbing blue light to generate electrons and holes corresponding thereto is used in the photoelectric conversion layer 61.

The first electrode 56, the photoelectric conversion layer 57 and the second electrode 58 which are included in the R photoelectric conversion part have configurations the same as those in the first electrode 11, the photoelectric conversion layer 12 and the second electrode 13 as illustrated in FIG. 1. However, a material capable of absorbing red light to generate electrons and holes corresponding thereto is used in the photoelectric conversion layer 57.

In a portion which is light shielded by the light-shielding layer 68 on the surface of the silicon substrate 41, n+ regions 43, 45 and 47 are formed, and the peripheries of the respective n+ regions are surrounded by p regions 42, 44 and 46.

The n+ region 43 is electrically connected to the first electrode 56 via a connecting part 54 formed in an opening which is opened in the dielectric layer 48 and made of a metal such as aluminum and tungsten and stores electrons which has transferred into the first electrode 56 via the connecting part 54. The connecting part 54 is electrically insulated from other parts than the first electrode 56 and the n+ region 43 by a dielectric layer 51.

The n+ region 45 is electrically connected to the first electrode 60 via a connecting part 53 made of a metal such as aluminum and tungsten, as formed in an opening which is opened in the dielectric layer 48, the R photoelectric conversion part and the dielectric layer 59 and stores electrons which has transferred into the first electrode 60 via the connecting part 53. The connecting part 53 is electrically insulated from other parts than the first electrode 60 and the n+ region 45 by a dielectric layer 50.

The n+ region 47 is electrically connected to the first electrode 64 via a connecting part 52 made of a metal such as aluminum and tungsten, as formed in an opening which is opened in the dielectric layer 48, the R photoelectric conversion part, the dielectric layer 59, the B photoelectric conversion part and the dielectric layer 63 and stores electrons which has transferred into the first electrode 64 via the connecting part 52. The connecting part 52 is electrically insulated from other parts than the first electrode 64 and the n+ region 47 by a dielectric layer 49.

The electron stored in the n+ region 43 is converted into a signal corresponding to the amount of a charge thereof by an MOS circuit (not illustrated) which is made of an n-channel MOS transistor formed within the p region 42; the electron stored in the n+ region 45 is converted into a signal corresponding to the amount of a charge thereof by an MOS circuit (not illustrated) which is made of an n-channel MOS transistor formed within the p region 44; and the electron stored in the n+ region 47 is converted into a signal corresponding to the amount of a charge thereof by an MOS circuit (not illustrated) which is made of an n-channel MOS transistor formed within the p region 46, which is then outputted into the outside of the solid-state imaging device 400. These MOS circuits configure a signal read-out part as set forth in the appended claims. Each of the MOS circuits is connected to a non-illustrated signal read-out pad by a wiring 55. Incidentally, the signal read-out part may be configured of CCD and an amplifier but not an MOS circuit. In other words, the signal read-out part may be configured such that the electrons as stored in the n+ region 43, 45 and 47 are read out into a charge transfer channel formed within the silicon substrate 41 and transferred into an amplifier, from which are then outputted signals corresponding to the electrons.

Incidentally, it is also possible to form an inorganic photoelectric conversion part made of an inorganic material, which is able to absorb light which has transmitted through the photoelectric conversion layers 65, 61 and 57, generating a charge corresponding to the subject light and storing the charge between the silicon substrate 41 and the first electrode 56 (for example, between the dielectric layer 48 and the silicon substrate 41). In this case, it is only required that an MOS circuit for reading out a signal corresponding to the charge stored in a charge storage region of this inorganic photoelectric conversion part is provided within the silicon substrate 41 and that the wiring 55 is connected to this MOS circuit, too.

In this way, the configuration in which plural photoelectric conversion parts having the configuration as illustrated in FIG. 1 are stacked on a silicon substrate can be realized by the configuration as illustrated in FIG. 4.

In the foregoing description, the "photoelectric conversion layer capable of absorbing B light" as referred to herein means a photoelectric conversion layer which is able to absorb at least light of from 400 to 500 nm and preferably has an absorptance of a peak wavelength in the subject wavelength region of 50% or more. The "photoelectric conversion layer capable of absorbing G light" as referred to herein means a photoelectric conversion layer which is able to absorb at least light of from 500 to 600 nm and preferably has an absorptance of a peak wavelength in the subject wavelength region of 50% or more. The "photoelectric conversion layer capable of absorbing R light" as referred to herein means a photoelectric conversion layer which is able to absorb at least light of from 600 to 700 nm and preferably has an absorptance of a peak wavelength in the subject wavelength region of 50% or more.

In the case of the configurations as in the first configuration example and the third configuration example, patterns for detecting colors in the order of BGR, BRG, GBR, GRB, RBG and RGB from the upper layer can be thought. It is preferable that the uppermost layer is a G layer. Furthermore, in the case of the configuration as in the second configuration example, when the upper layer is an R layer, the lower layer can be a combination of a B layer and a G layer formed in the same planar state; when the upper layer is a B layer, the lower layer can be a combination of a G layer and an R layer formed in the same planar state; and when the upper layer is a G layer, the lower layer can be a combination of a B layer and an R layer formed in the same planar state. Of these, a configuration as illustrated in FIG. 3 in which the upper layer is a G layer and the lower layer is a combination of a B layer and an R layer formed in the same planar state is preferable.

Incidentally, the first to third configuration embodiments, in the case where the second electrode 13 is an electron collecting electrode, in FIG. 2, there may be taken a configuration such that the connecting part 9 is connected to the second electrode 13; in FIG. 3, there may be taken a configuration such that the connecting part 27 is connected to the second electrode 13; and in FIG. 4, there may be taken a configuration such that the connecting part 54 is connected to the second electrode 58, that the connecting part 53 is connected to the second electrode 62 and that the connecting part 52 is connected to the second electrode 66, respectively. Furthermore, in the case of obtaining signals corresponding to holes, a channel of each region within the silicon substrate may be reversed.

The solid-state imaging device explained in the present embodiment is configured such that the one pixel as illustrated in FIGS. 2 to 4 is disposed in a plural number in an array state on the same plane. Since color signals of RGB can be obtained by this one pixel, it can be thought that this one pixel is a photoelectric conversion device for converting RGB lights into electric signals. For that reason, the solid-state imaging device explained in the present embodiment is configured such that a number of the photoelectric conversion device as illustrated in FIGS. 2 to 4 are disposed in an array state on the same plane,

EXAMPLES

The effects of the invention will be demonstrated below with reference to the following Examples.

Comparative Example 1

Figure 5:
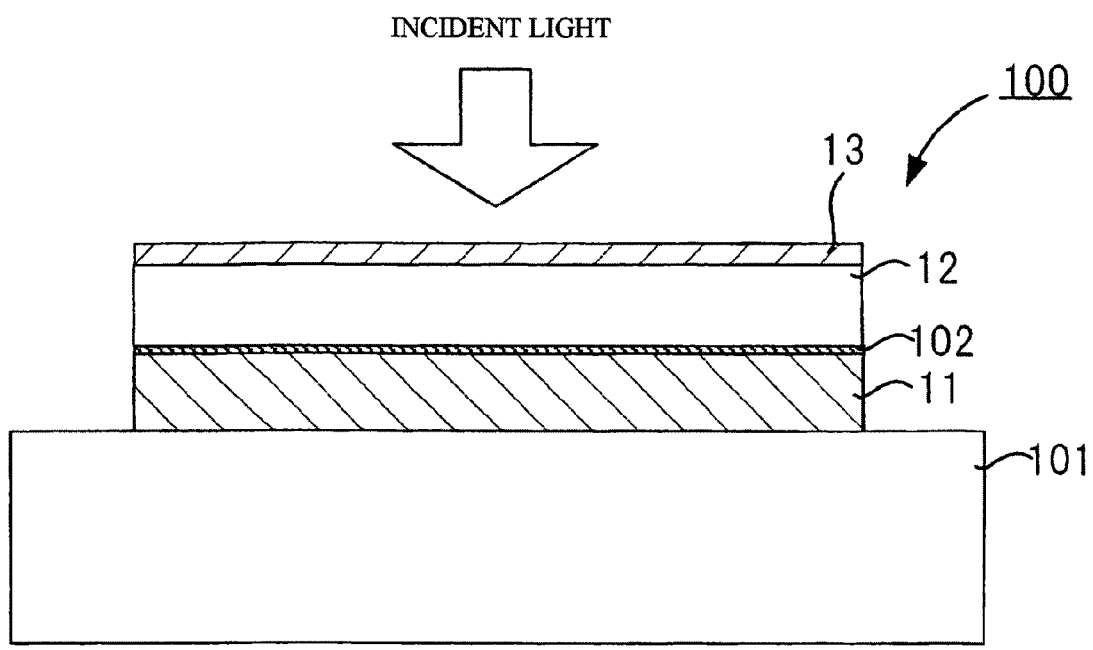
FIG. 5 is a schematic cross-sectional view to show a configuration of the photoelectric conversion device prepared in Comparative Example 1.

As Comparative Example 1, a photoelectric conversion device as illustrated in FIG. 5, in which the smoothing layer 104 is not provided in the photoelectric conversion device as illustrated in FIG. 1, was prepared. In FIG. 5, configurations the same as in FIG. 1 are given the same symbols. ITO was used as a material of each of the first electrode 11 and the second electrode 13 and formed by an RF magnetron sputtering method. Quinacridone was used as a material of the photoelectric conversion layer 12 and formed by vapor deposition. In was used as a material of the work function adjusting layer 102 and formed by vapor deposition. A thickness of the first electrode 11 was 100 nm; a thickness of the work function adjusting layer 102 was 2 nm; a thickness of the photoelectric conversion layer 12 was 100 nm; and a thickness of the second electrode 13 was 10 nm. Incidentally, a transmittance of visible light of the work function adjusting layer 102 was about 98%. Twelve devices having a device area of 2 mm×2 mm as illustrated in FIG. 5 were prepared.

Figure 6A:
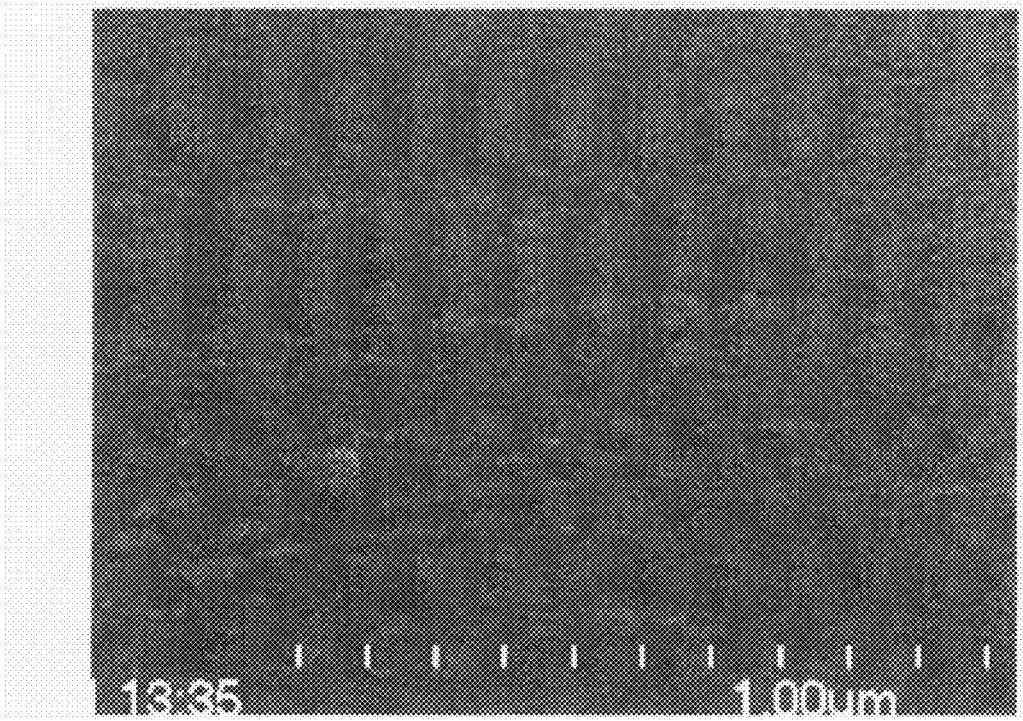
FIGS. 6A, 6B and 6C are each a surface SEM image of a photoelectric conversion device prepared in Comparative Example 1.
Figure 6B:
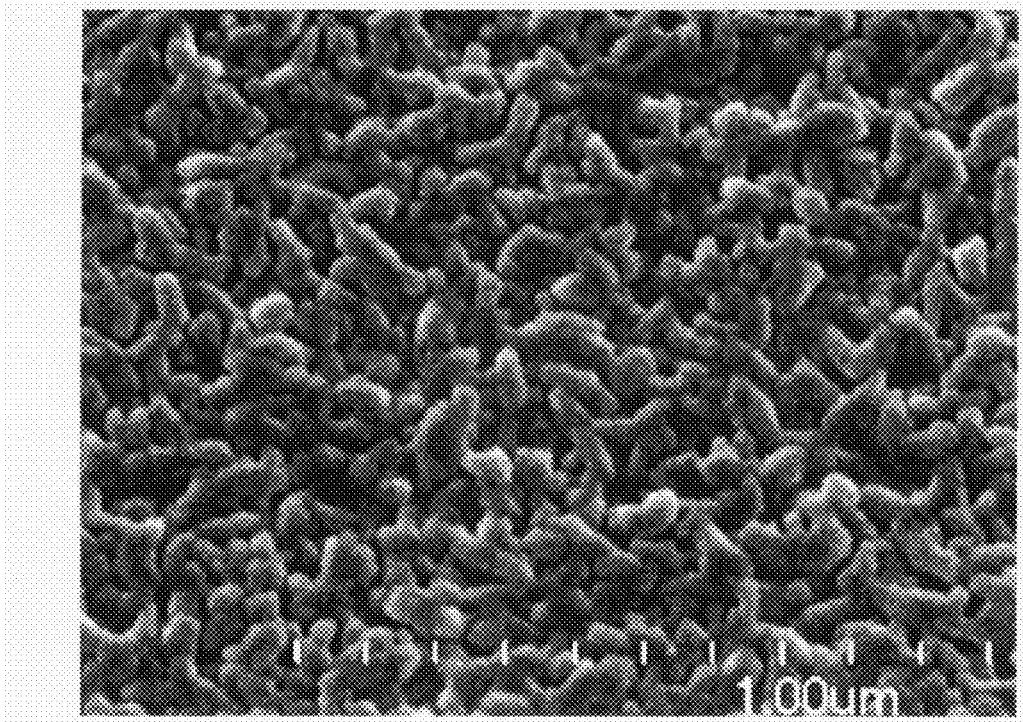
Figure 6C:
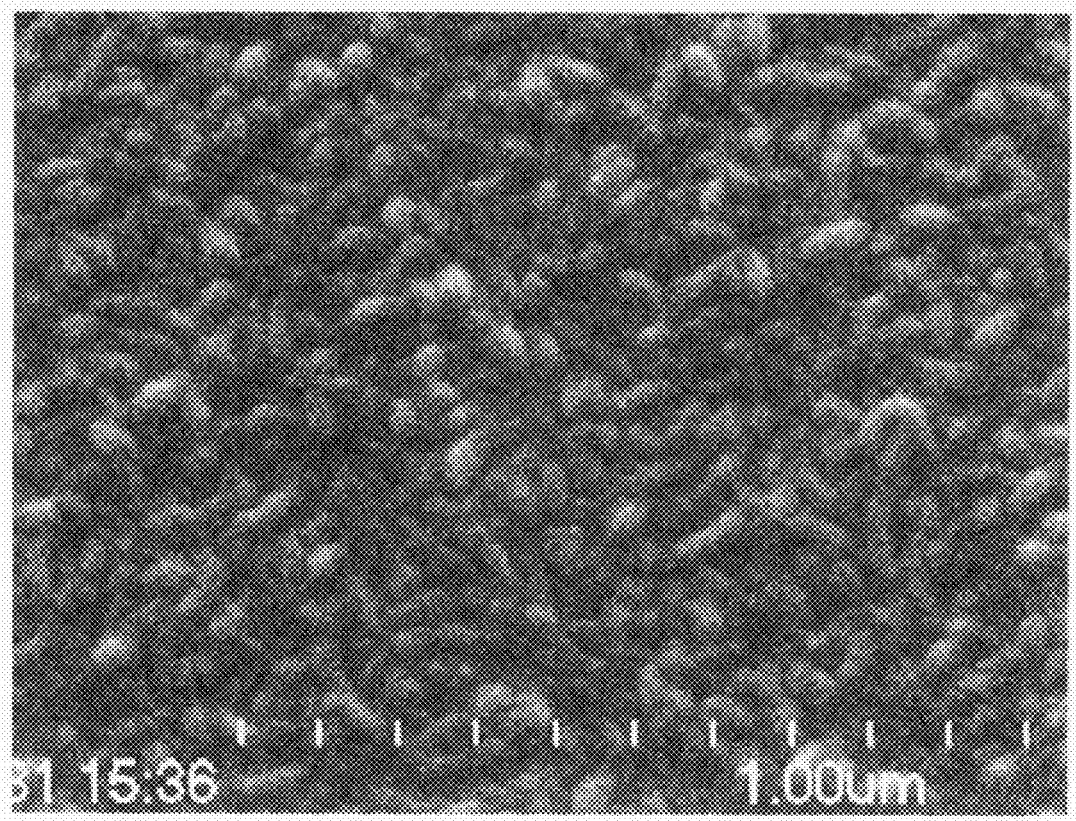

Signals obtainable from the twelve photoelectric conversion devices were measured. As a result, in ten of the twelve devices, a short circuit was explicitly caused, and a dark current was 1 $\mu A/cm^2$ or more even at an extremely low bias voltage. Thus, these devices could not function as a photoelectric conversion device. This cause was deduced from surface SEM images of a photoelectric conversion device as shown in FIGS. 6A to 6C. FIG. 6A is a surface SEM image when ITO (thickness: 100 nm) was formed on a glass substrate by a sputtering method; FIG. 6B is a surface SEM image when ITO (100 nm), In (2 nm) and QA (100 nm) were stacked on a glass substrate; and FIG. 6C is a surface SEM image when ITO (100 nm), In (2 nm), QA (100 nm) and ITO (10 nm) were stacked on a glass substrate.

Since QA is a highly crystalline pigment based material, its vapor deposited layer is formed as an aggregate of fine crystals, and gaps among the fine crystals are present everywhere (see FIG. 6B). It is thought that at the time of ITO sputtering, the sputtered particles enter into the gaps and are liable to be connected to the second electrode, thereby frequently causing a short circuit. Actually, though the surface SEM image of 100 nm-thick ITO on the glass substrate as shown in FIG. 6A is uniformly flat, in the case 10 nm-thick ITO is deposited on QA, roughness of the ITO surface increases because of the roughness of QA beneath ITO (see FIG. 6C). This matter demonstrates that the sputtered particles enter into the ITO electrode along the depressed area of the QA surface. Furthermore, even if the upper ITO electrode is not directly connected to the lower ITO electrode, when the sputtered particles enter into the depressed area and the distance between the upper electrode and the lower electrode becomes short locally, a large electric field is locally generated when a bias voltage is applied, leading to an increase of leak current. From these reasons, we have reached a thought that roughness is reduced by stacking an amorphous material on QA. In addition, it is thought that covering the upper part of the photoelectric conversion material is advantageous from the viewpoint of protecting a photoelectric conversion material from damaging due to plasma during the sputtering deposition.

Example 1

Figure 7A:
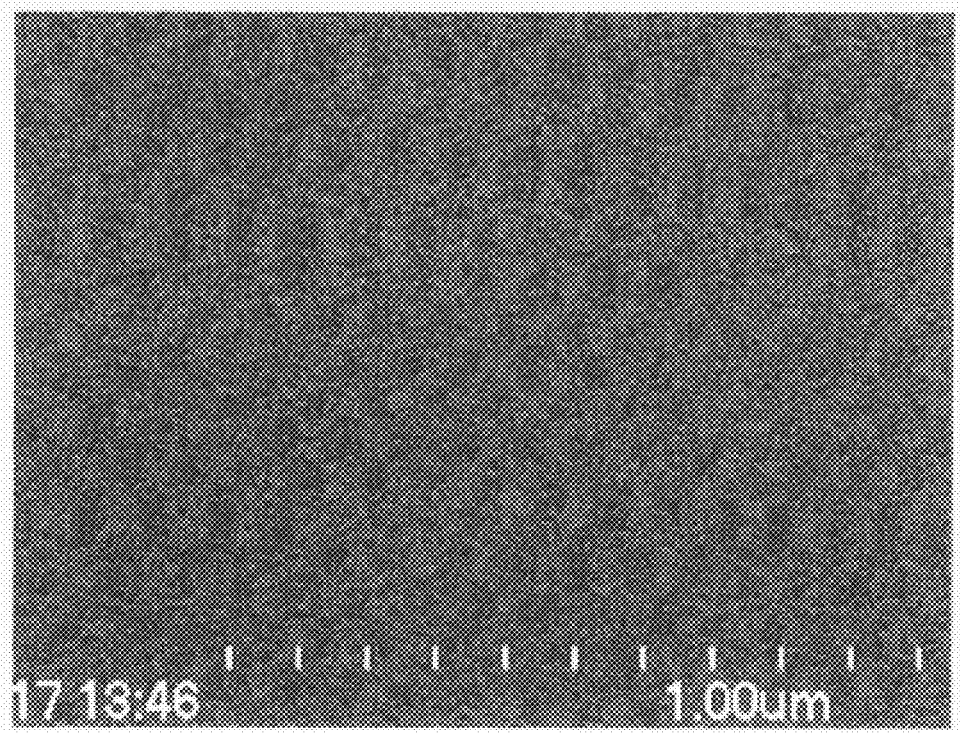
FIGS. 7A and 7B are each a surface SEM image of a photoelectric conversion device prepared in Example 1.
Figure 7B:
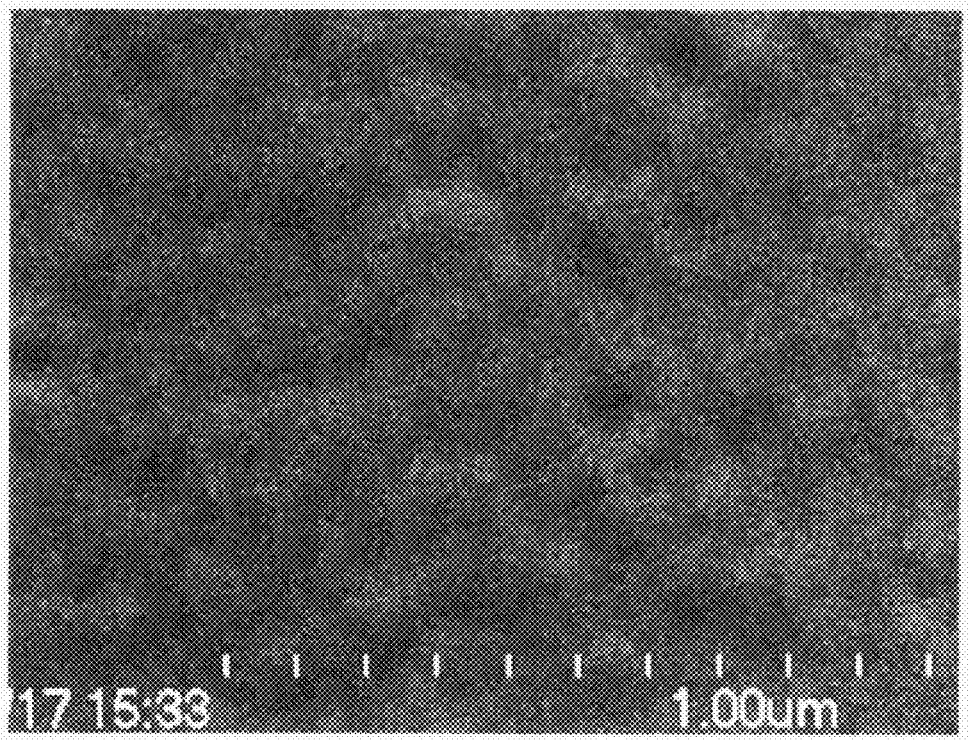

As Example 1, a photoelectric conversion device having the configuration as illustrated in FIG. 1 was prepared. ITO was used as a material of each of the first electrode 11 and the second electrode 13 and formed by an RF magnetron sputtering method. Quinacridone was used as a material of the photoelectric conversion layer 12 and formed by vapor deposition. In was used as a material of the work function adjusting layer 102 and formed by vapor deposition. m-MTDATA was used as a material of the smoothing layer 104 and formed by vapor deposition. A thickness of the first electrode 11 was 100 nm; a thickness of the work function adjusting layer 102 was 2 nm; a thickness of the photoelectric conversion layer 12 was 100 nm; a thickness of the smoothing layer 104 was 100 nm; and a thickness of the second electrode 13 was 10 nm. Twelve devices having a device area of 2 mm×2 mm and having the configuration as illustrated in FIG. 1 were prepared. FIG. 7A is a surface SEM image when ITO (100 nm), In (2 nm), QA (100 nm) and m-MTDATA (100 nm) were stacked on a glass substrate; and FIG. 7B is a surface SEM image when ITO (100 nm), In (2 nm), QA (100 nm), m-MTDATA (100 nm) and ITO (10 nm) were stacked on a glass substrate It is known that most materials having triphenylamine structures connected to each other are hole transporting organic semiconductors and become amorphous layers by vapor deposition because of their bulkiness. Accordingly, these materials are suitable for reducing roughness of the surface of QA. Actually, it is noted that as shown in the surface SEM image (FIG. 7A) after the deposition of 100 nm-thick m-MTDATA on QA, the roughness of the surface of QA can be completely smoothened. With respect to changes of the roughness by stacking of 100 nm-thick m-MTDATA on QA, measurement results obtained by using an atomic force microscope (measured in the range of 1 μm×1 μm by SPA400, manufactured by Seiko Instruments Inc.) are shown in Table 3. It is noted that by stacking 100 nm-thick m-MTDATA on QA, a mean surface roughness Ra of the surface of m-MTDATA is 0.8 nm, whereby the roughness of the surface of QA are reduced. Incidentally, in order to prevent a short circuit of the photoelectric conversion device from occurring, it is preferable that a mean surface roughness Ra of the smoothing layer is not more than 1 nm.

TABLE 3

| | Average roughness Ra (nm) | Peak and valley difference P – V (nm) | Root mean surface roughness RMS (nm) |
|---|---|---|---|
| ITO/In/QA (100 nm) | 2.1 | 25 | 2.7 |
| ITO/In/QA (100 nm)/ m-MTDATA (100 nm) | 0.8 | 9 | 1.2 |

In addition, as shown in the surface SEM image (FIG. 7B) when 10 nm-thick ITO is deposited by sputtering on m-MTDATA, it is noted that though roughness is slightly observed due to damaging by sputtering, the roughness is remarkably reduced as compared with the case of FIG. 6C in which the ITO sputtering deposition is achieved right above QA. Also, signals obtainable from the photoelectric conversion device of Example 1 were measured. As a result, only one of the twelve devices caused a short circuit, whereby a large effect for preventing a short circuit from occurring was observed.

The device performance of the photoelectric conversion device of Example 1 will be hereunder described in detail.

Figure 9:
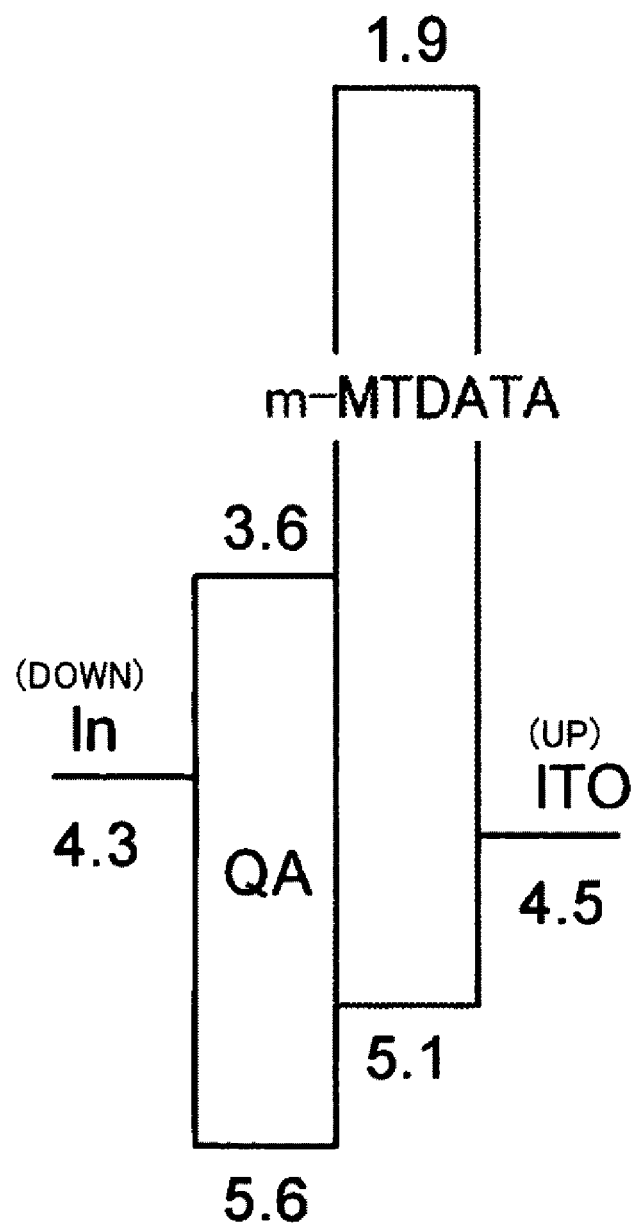
FIG. 9 is an energy diagram of a photoelectric conversion device prepared in Example 1.
Figure 10:
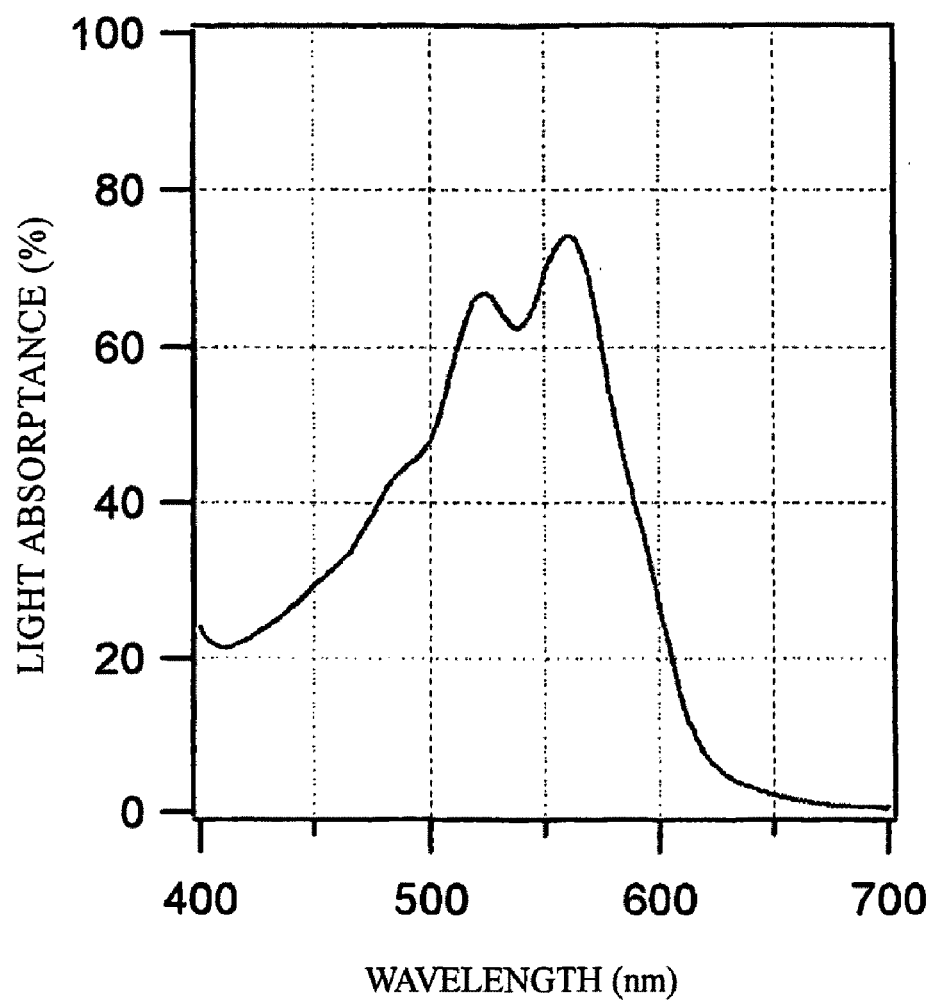
FIG. 10 shows the absorption spectrum of the photoelectric conversion device prepared in Example 1.
Figure 11:
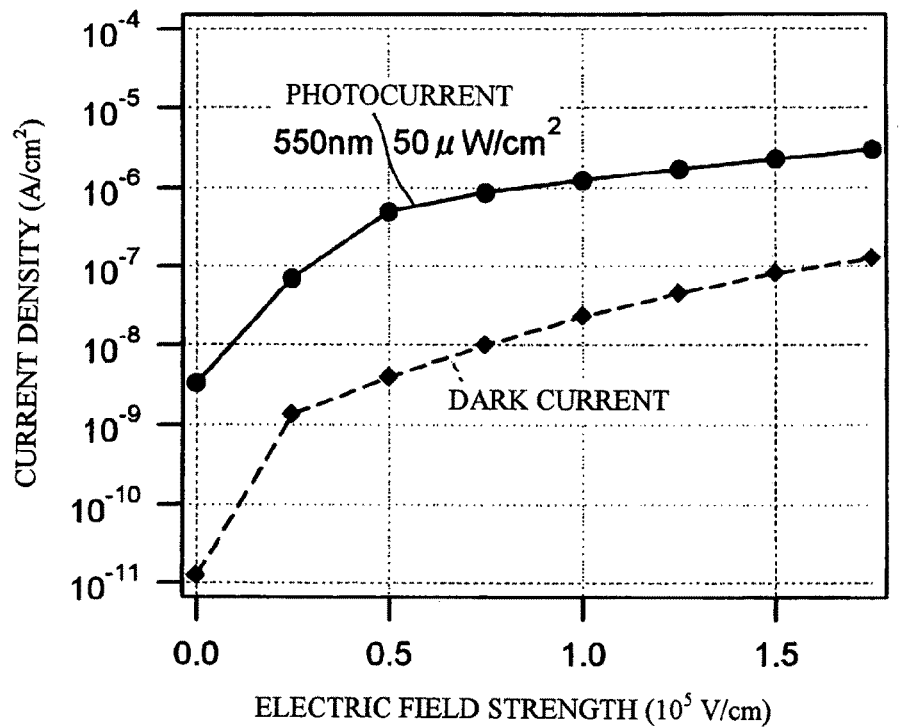
FIG. 11 shows the bias voltage dependence of dark current and photocurrent of the photoelectric conversion device prepared in Example 1.
Figure 12:
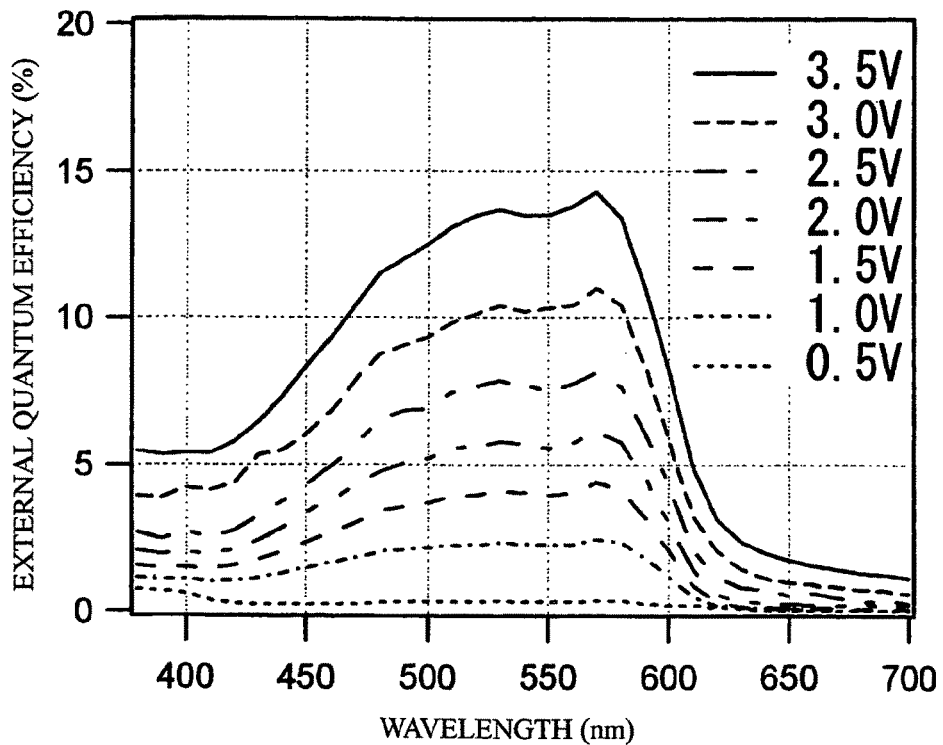
FIG. 12 shows the action spectrum of the photoelectric conversion device prepared in Example 1.
Figure 13:
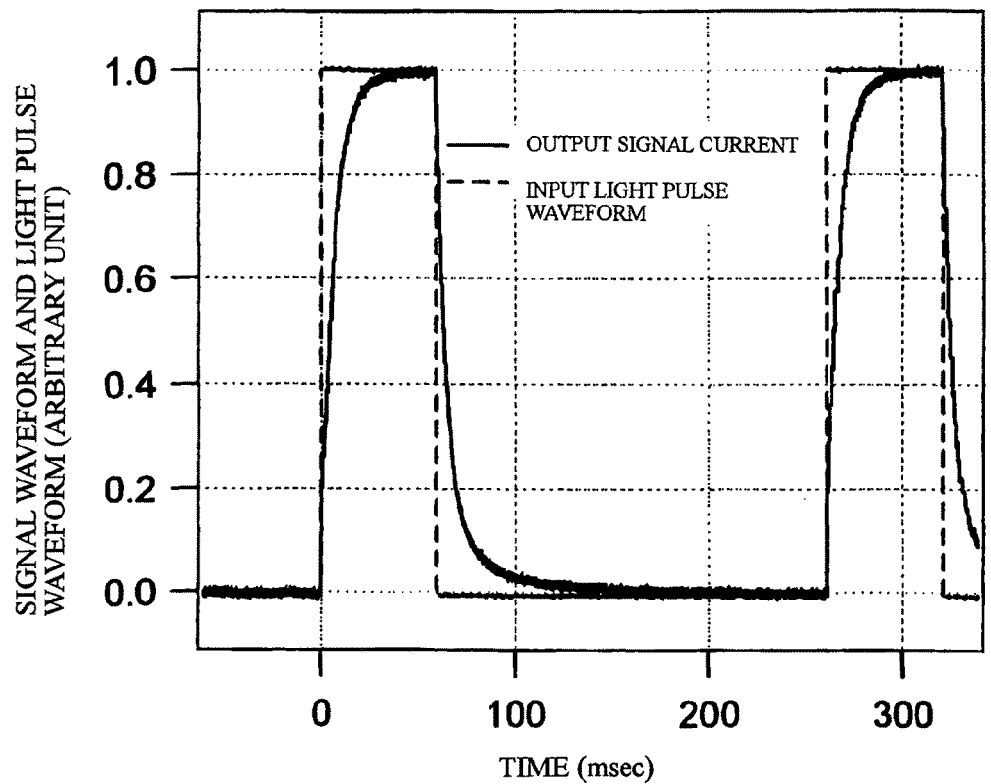
FIG. 13 shows the response speed of the photoelectric conversion device prepared in Example 1.

FIG. 9 shows an energy diagram of each of the materials in this device. Since m-MTDATA is a hole transporting material, it is preferable that s are read out by the first electrode 11. By forming an thin layer of In having a thickness of 2 nm on ITO as the first electrode 11, a reduction of dark current and a lowering of drive voltage are realized as described in detail in Japanese Patent Application No. 2005-251745. An absorption spectrum of this device is shown in FIG. 10; and it is noted that G light is principally absorbed. A relationship between photocurrent and dark current is shown in FIG. 11; and an action spectrum is shown in FIG. 12. A bias is applied such that the first electrode 11 is in a positive direction against the second electrode 13. This device has such characteristic features that it has a device configuration sandwiched by transparent electrodes and that an external quantum efficiency of from about 5 to 10% is obtained at a low bias of several volts. Furthermore, it is noted from the action spectrum that the device is a photoelectric conversion device principally in response to G light. A response speed of this device is shown in FIG. 13. A rectangular wave signal is an irradiation pulse of a light emitting diode of G light, and a signal which follows delayed slightly is an output signal of a device irradiated with that pulse. A time for reaching 90% of the response signal is about 10 ms. Since an electric field of the photoelectric conversion layer 12 becomes uniform by the invention, in the case where this device is disposed in an array state to realize an imaging device, variation of the device performances is small, whereby it becomes possible to achieve imaging stably even at an imaging rate of 30 frames per second.

Example 2

Figure 8A:
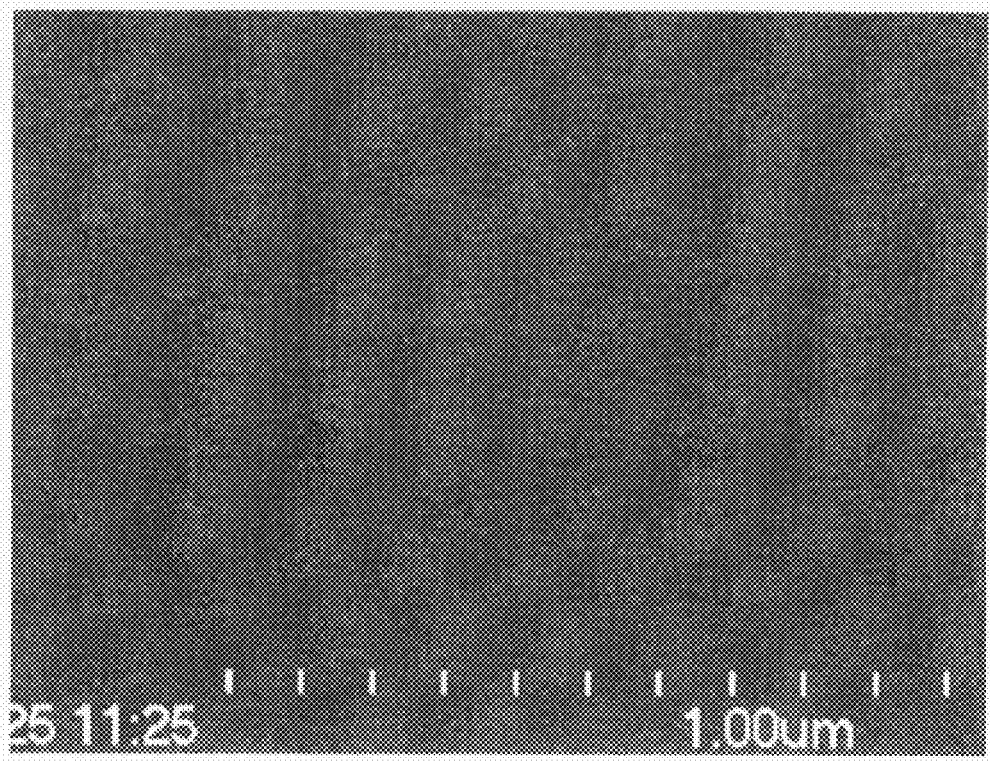
FIGS. 8A and 8B are each a surface SEM image of a photoelectric conversion device prepared in Example 2.
Figure 8B:
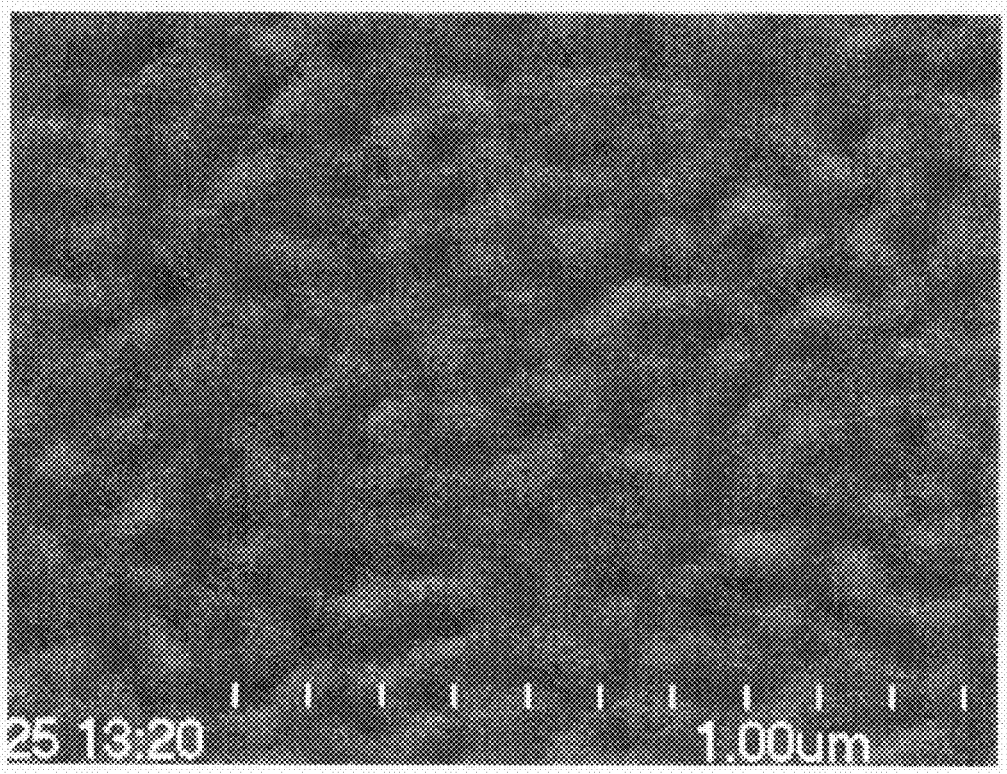

As Example 2, a photoelectric conversion device was prepared in the same manner as in Example 1, except for changing the material of the smoothing layer 104 to Amine A. The smoothing layer 104 was formed in a thickness of 100 nm by vapor deposition. Twelve devices having such a configuration and having a device area of 2 mm×2 mm were prepared. FIG. 8A is a surface SEM image when ITO (100 nm), In (2 nm), QA (100 nm) and Amine A (100 nm) were stacked on a glass substrate; and FIG. 8B is a surface SEM image when ITO (100 nm), In (2 nm), QA (100 nm), Amine A (100 nm) and ITO (10 nm) were stacked on a glass substrate.

It is noted that as shown in the surface SEM image (FIG. 8A) after the deposition of 100 nm-thick Amine A on QA, roughness of the surface of QA can be completely smoothened. Furthermore, as shown in the surface SEM image (FIG. 8B) when 10 nm-thick ITO is deposited by sputtering on Amine A, it is noted that though roughness is slightly observed due to damaging by sputtering, the roughness is remarkably reduced as compared with the case of FIG. 6C in which the ITO is deposited by sputtering right above QA. Also, signals obtainable from the photoelectric conversion device of Example 2 were measured. As a result, two of the twelve devices caused a short circuit, whereby a large effect for preventing a short circuit from occurring was observed.

Example 3

As Example 3, a photoelectric conversion device was prepared in the same manner as in Example 1, except for changing the material of the smoothing layer 104 to Alq3. The smoothing layer 104 was formed in a thickness of 50 nm by vapor deposition. Twelve devices having such a configuration and having a device area of 2 mm×2 mm were prepared.

With respect to the thus prepared photoelectric conversion device, signals obtainable from the photoelectric conversion device were measured while using the first electrode 11 as a hole collecting electrode and the second electrode 13 as an electron collecting electrode, respectively. As a result, four of the twelve devices caused a short circuit, whereby a large effect for preventing a short circuit from occurring was observed.

Example 4

Figure 14:
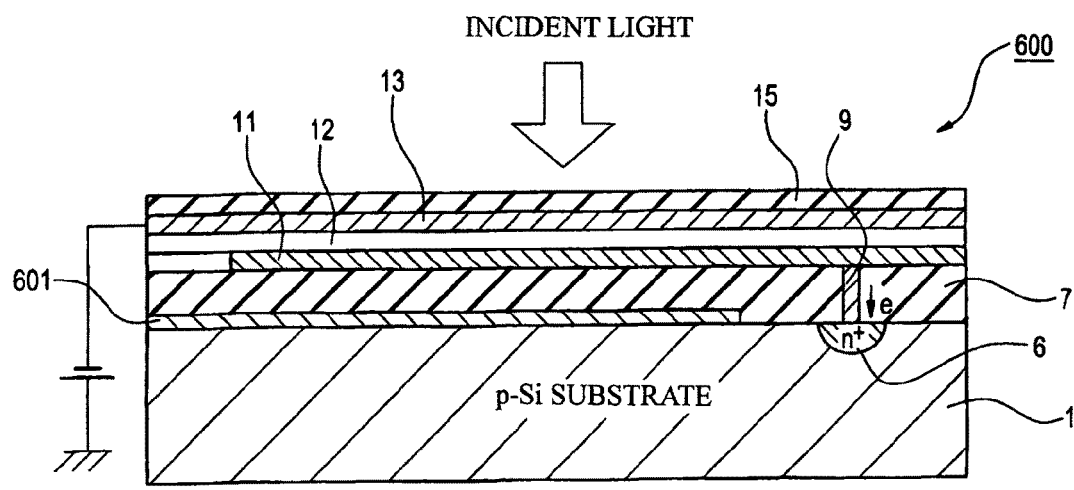
FIG. 14 is a sectional schematic view to show an outline configuration of the solid-state imaging device prepared in Example 4.

Subsequently, as Example 4, in order to corroborate the operation as an imaging device, a solid-state imaging device 600 having one pixel as illustrated in FIG. 14 was prepared by deleting the light-shielding layer 14, the dielectric layer 8, the p region 5, the n region 4, the p region 3 and the n region 2 and adding a light-shield layer 601 for light shielding the signal read-out part formed on the silicon substrate 1 in the solid-state imaging device having the configuration as illustrated in FIG. 2. In FIG. 14, configurations the same as in FIG. 2 are given the same symbols. A CMOS circuit was used as the signal read-out part.

Figure 15:
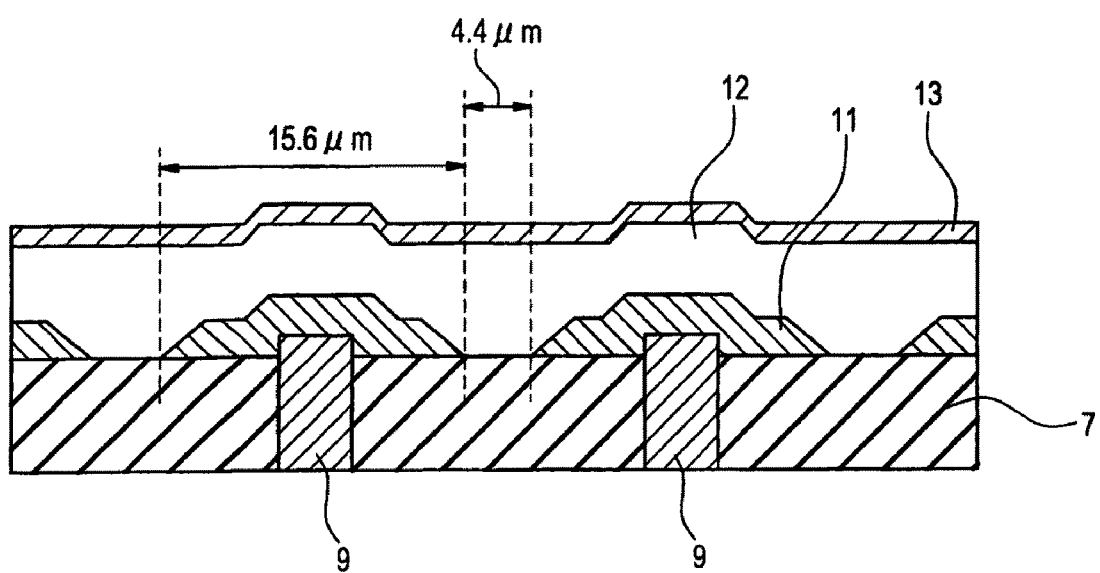
FIG. 15 is a sectional schematic view to show an outline configuration of the solid-state imaging device prepared in Example 4.
Figure 16A:
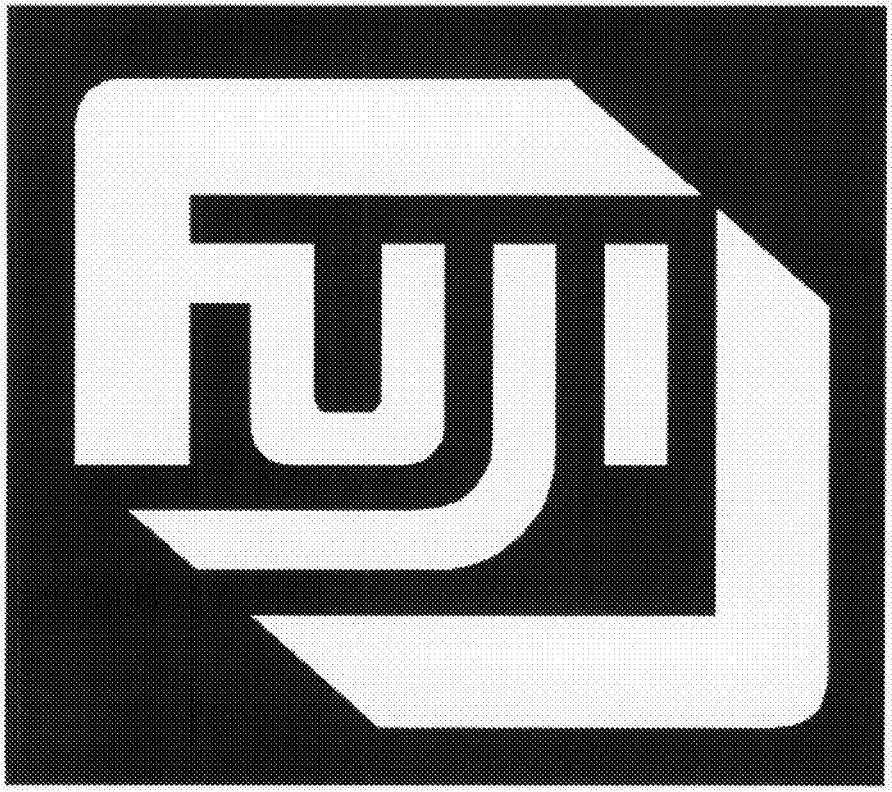
FIGS. 16A and 16B show an original image of photographic subject and its image taken by a solid-state imaging device prepared in Example 4, respectively.
Figure 16B:
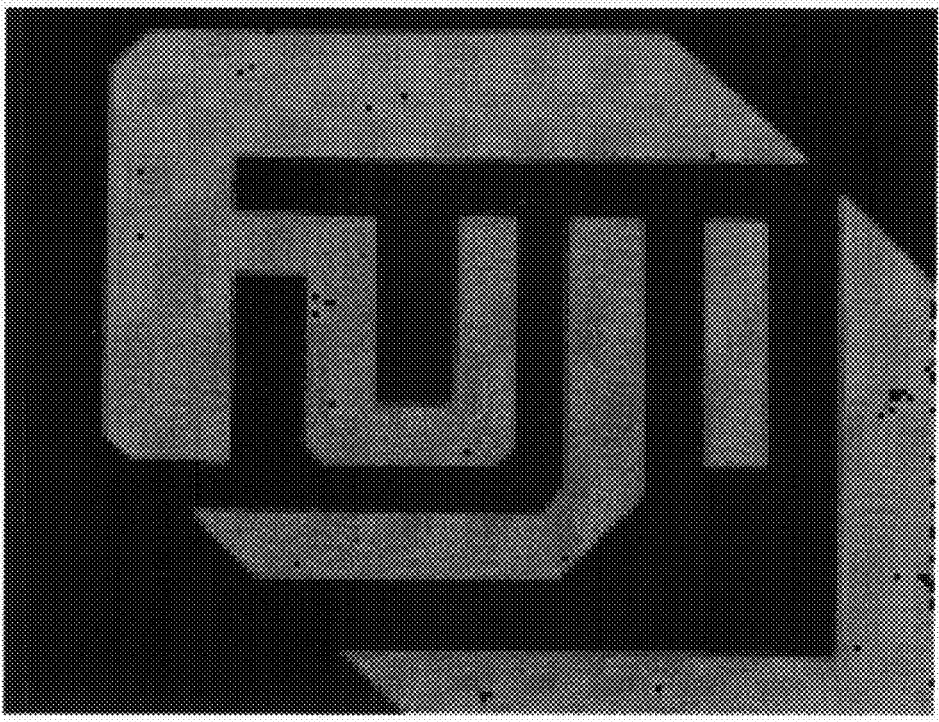

FIG. 15 is a sectional schematic view of a portion of two pixels of the solid-state imaging device 600 prepared in Example 4. In FIG. 15, configurations the same as in FIG. 14 are given the same symbols. Furthermore, in FIG. 15, the work function adjusting layer 102 and the smoothing layer 104 as illustrated in FIG. 1 are omitted from illustration.

In the solid-state imaging device 600, pixels of 160×120 are formed, and the first electrode 11 (material: ITO) of each pixel is connected to the charge storage part 6 through the connecting part 9. An arrangement pitch of pixels is 20 µm; a size of the first electrode 11 in surface view is 15.6 µm in square; and a distance between the first electrodes 11 is 4.4 µm. In was formed in a thickness of 2 nm as the work function adjusting layer 102 on this first electrode 11 by vacuum vapor deposition; QA was formed in a thickness of 100 nm as the photoelectric conversion layer 12 by vacuum vapor deposition; m-MTDATA was formed in a thickness of 100 nm as the smoothing layer 104 by vacuum vapor deposition; and ITO was formed in a thickness of 10 nm as the second electrode 13 by sputtering. Finally, connection was taken such that a bias was applied to the upper ITO electrode, thereby preparing a solid-stage imaging device. Incidentally, a color filter and a micro lens are not formed. Furthermore, an output rate was 30 frames per second.

Figure 17A:
FIGS. 17A and 17B show an original image of photographic subject and its image taken by a solid-state imaging device prepared in Example 4, respectively.
Figure 17B:
Figure 18:
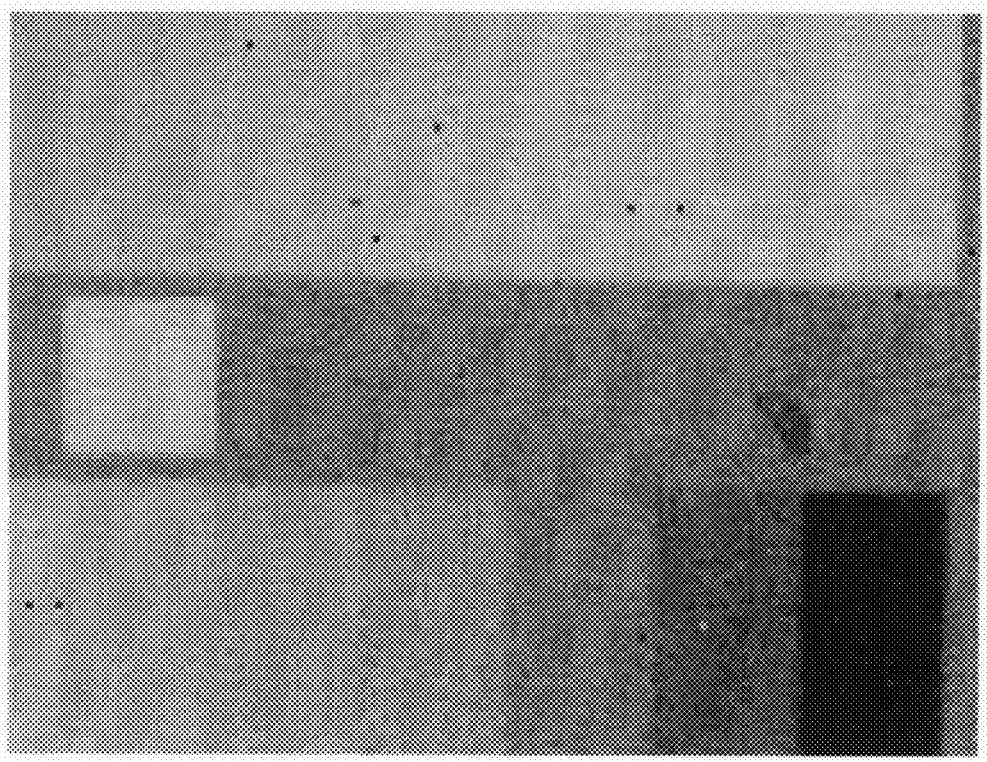
FIG. 18 shows an original image of the gray scale chart and its image taken by a solid-state imaging device prepared in Example 4.
Figure 19:
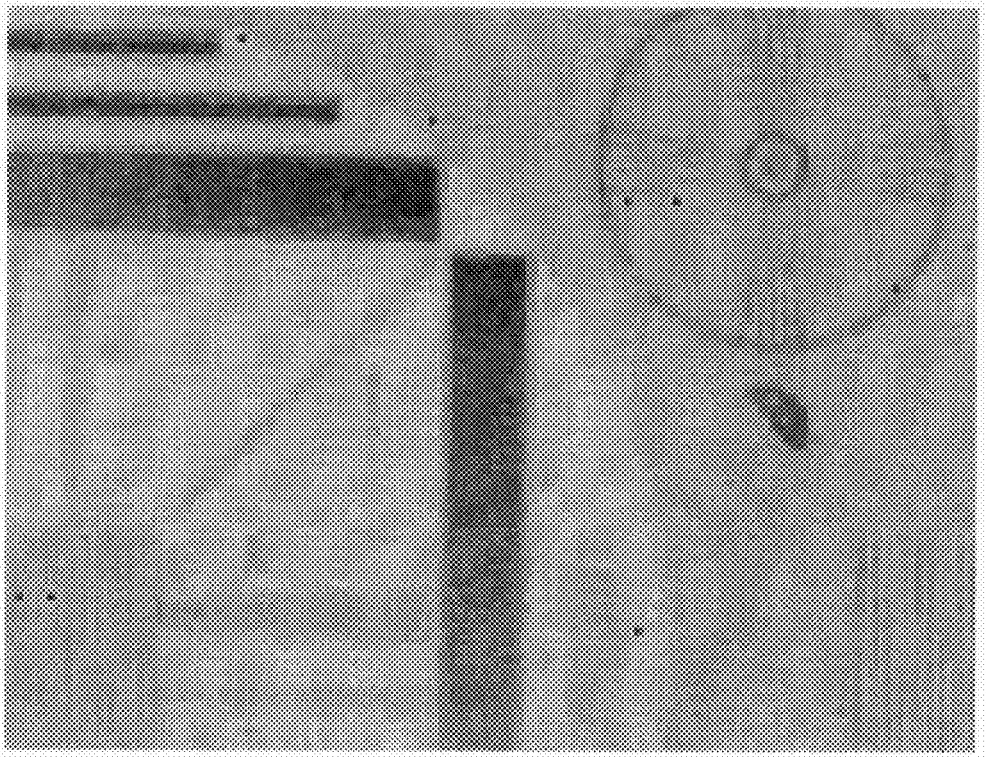
FIG. 19 shows an original image of the resolution chart and its image taken by a solid-state imaging device prepared in Example 4.

FIGS. 16, 17, 18 and 19 are pictures taken by the solid state imaging device of this Example 4 under the condition that a bias voltage between the first electrode 11 and the second electrode 12 is about 1.5V. FIG. 16A is a logo of Fujifilm Corporation; and FIG. 16B is a picture of this logo taken by the device of Example 4. FIG. 17A is a Japanese doll; and FIG. 17B is a picture of this Japanese doll taken by the device of Example 4. FIG. 18 is a picture of a gray scale chart taken by the device of Example 4. FIG. 19 is a picture of a resolution chart taken by the device of Example 4. It is particularly worth noting that the operation of this organic device as an imaging device has been realized at a low bias as 1.5 V.

A portion of the collar of the Japanese doll of FIG. 17A is colored red. Since the solid-state imaging device of Example 4 does not respond to R light, a portion of the collar of FIG. 17B of the Japanese doll became dark in the imaging result of FIG. 17B. It is noted from this matter that the imaging device of Example 4 certainly selects the wavelength and causes photoelectric conversion.

Next, an effect for reducing a dark current by adjusting the work function of the electron collecting electrode at not more than 4.5 eV described in the foregoing embodiment will be demonstrated below with reference to the following Examples.

Comparative Example 2

In Comparative Example 2, there is enumerated the case of collecting electrons in a side of an ITO lower electrode by a structure in which QA having a thickness of 100 nm and an Al upper electrode (work function determined by a photoelectron spectrometer in air AC-2, manufactured by Riken Keiki Co., Ltd.: 4.3 eV, light transmittance in visible region: 0%) having a thickness of 100 nm are stacked in this order on a glass substrate (a commercial product) having stacked thereon an ITO lower electrode (4.8 eV, light transmittance in visible region: about 90%) having a thickness of 250 nm by vacuum vapor deposition. As a result of actually fabricating a device having a device area of 2 mm×2 mm and measuring it, a dark current became a large value as 9.3 µA/cm$^2$ at the applied voltage of 1 V (the electrons were collected by applying a positive bias to the lower electrode; hereinafter the same).

In this case, it is thought that since the work function of the ITO lower electrode which is an electron collecting electrode is high, the injection of holes from the ITO lower electrode into the QA is liable to occur when a bias voltage is applied and that the dark current becomes large.

Example 5

On the other hand, a device was prepared in the same manner as in Comparative Example 2, except for forming In thin layer having a low work function as 4.3 eV in a thickness of 2 nm between the ITO lower electrode and the QA by vacuum vapor deposition (light transmittance in visible region of 2 nm-thick In: about 98%). As a result, the dark current at the applied voltage of 1 V was 1.8 nA/cm$^2$ and was largely reduced by about four orders. This demonstrates that by making the work function of the lower electrode which is an electron collecting electrode small, the injection of holes from the electron collecting electrode was largely reduced.

When the device of this Example 5 was illuminated from a side of the lower ITO by 550 nm light at an intensity of 50 µW/cm$^2$ under the same condition of applying a bias of 1 V, an external quantum efficiency (the number of measured charges to the number of incident photons) was 12%. Furthermore, a dark current was about 100 nA/cm$^2$, and an external quantum efficiency was 19% when a bias voltage of 2 V is applied.

Incidentally, while a smoothing layer is not provided in Comparative Example 2 and Example 5, the same effects are obtainable even in the case of providing a smoothing layer.

This application is based on Japanese Patent application JP 2006-45955, filed Feb. 22, 2006, the entire content of which is hereby incorporated by reference, the same as if set forth at length.

What is claimed is:

1. A photoelectric conversion device comprising a photoelectric conversion part including a first electrode, a second electrode opposing to the first electrode and a photoelectric conversion layer provided between the first electrode and the second electrode, wherein
    a smoothing layer for reducing roughness of a surface of the photoelectric conversion layer is provided as a single layer on the photoelectric conversion layer and in direct contact with the first electrode or the second electrode and the photoelectric conversion layer; wherein
    the smoothing layer comprises an amorphous material;
    the smoothing layer comprises an organic material;
    the smoothing layer is transparent, and
    the smoothing layer has a surface having a mean surface roughness Ra of not more than 1 nm.

2. The photoelectric conversion device according to claim 1, wherein the photoelectric conversion layer comprises an organic polycrystalline material.

3. The photoelectric conversion device according to claim 2, wherein the organic polycrystalline material contains a material having a quinacridone skeleton.

4. The photoelectric conversion device according to claim 1, wherein the smoothing layer has a thickness of from 10 to 300 nm.

5. A photoelectric conversion device comprising a photoelectric conversion part including a first electrode, a second electrode opposing to the first electrode, a photoelectric conversion layer provided between the first electrode and the second electrode, and a smoothing layer for reducing roughness of a surface of the photoelectric conversion layer, wherein the second electrode is an electrode in a light incident side;

the smoothing layer is provided as a single layer on the photoelectric conversion layer and is in direct contact with the second electrode and the photoelectric conversion layer; wherein the smoothing layer comprises an amorphous material;
the smoothing layer comprises an organic material;
the smoothing layer is transparent;
the smoothing layer has a surface having a mean surface roughness Ra of not more than 1 nm, and the first electrode is an electrode for collecting electrons, and the second electrode is an electrode for collecting holes.

6. The photoelectric conversion device according to claim 5, wherein the smoothing layer comprises a hole transporting material.

7. The photoelectric conversion device according to claim 6, wherein the hole transporting material has a triphenylamine structure.

8. The photoelectric conversion device according to claim 7, wherein the hole transporting material has a starburst amine structure.

9. The photoelectric conversion device according to claim 5, wherein the first electrode has a work function of not more than 4.5 eV.

10. The photoelectric conversion device according to claim 1, wherein the first electrode is ITO, and a layer of In is provided between the ITO and the photoelectric conversion layer.

11. A photoelectric conversion device comprising a photoelectric conversion part including a first electrode, a second electrode opposing to the first electrode, a photoelectric conversion layer provided between the first electrode and the second electrode, and a smoothing layer for reducing roughness of a surface of the photoelectric conversion layer, wherein the second electrode is an electrode in a light incident side;

the smoothing layer is provided as a single layer on the photoelectric conversion layer and is in direct contact with the second electrode and the photoelectric conversion layer; wherein the smoothing layer comprises an amorphous material;
the smoothing layer comprises an organic material;
the smoothing layer is transparent;
the smoothing layer has a surface having a mean surface roughness Ra of not more than 1 nm, and the first electrode is an electrode for collecting holes, and the second electrode is an electrode for collecting electrons.

12. The photoelectric conversion device according to claim 11, wherein the smoothing layer comprises an electron transporting material.

13. The photoelectric conversion device according to claim 12, wherein the electron transporting material is Alq3.

14. The photoelectric conversion device according to claim 11, wherein the second electrode has a work function of not more than 4.4 eV.

15. The photoelectric conversion device according to claim 14, wherein the second electrode is Cs-doped ITO.

16. The photoelectric conversion device according to claim 1, wherein at least one of the first electrode and the second electrode is a transparent electrode.

17. The photoelectric conversion device according to claim 16, wherein both the first electrode and the second electrode are a transparent electrode.

18. The photoelectric conversion device according to claim 16, wherein the transparent electrode is a layer containing a transparent conductive oxide.

19. The photoelectric conversion device according to claim 18, wherein the transparent conductive oxide is ITO.

20. The photoelectric conversion device according to claim 16, wherein the transparent electrode is a layer made of a metal formed by vapor deposition.

21. The photoelectric conversion device according to claim 1, wherein the first electrode and the second electrode each has a thickness of from 5 to 200 nm.

22. The photoelectric conversion device according to claim 1, which comprises:

a semiconductor substrate having at least one of the photoelectric conversion part stacked on the upper side thereof;

a charge storage part in the semiconductor substrate for storing a charge generated in the photoelectric conversion layer in the photoelectric conversion part; and a connecting part for electrically connecting the first electrode or the second electrode of the photoelectric conversion part to the charge storage part.

23. The photoelectric conversion device according to claim 22, further comprising a photoelectric conversion part in the semiconductor substrate for absorbing light which has transmitted through the photoelectric conversion layer in the photoelectric conversion part, generating a charge corresponding to the light and storing the generated charge in the semiconductor substrate.

24. The photoelectric conversion device according to claim 23, wherein the photoelectric conversion part within the semiconductor substrate comprises plural photodiodes stacked within the semiconductor substrate for absorbing light of a different color, respectively.

25. The photoelectric conversion device according to claim 23, wherein the photoelectric conversion part in the semiconductor substrate comprises plural photodiodes within the semiconductor substrate for absorbing light of a different color, respectively, arranged in a direction vertical to a direction of the incident light.

26. The photoelectric conversion device according to claim 24, wherein one of the photoelectric conversion part is stacked on the upper side of the semiconductor substrate, the plural photodiodes are a photodiode having a p-n junction provided in a suitable position for absorbing blue light and a photodiode having a p-n junction provided in a suitable position for absorbing red light, and the photoelectric conversion layer in the photoelectric conversion part absorbs green light.

27. A solid-state imaging device including a number of the photoelectric conversion device according to claim 22, provided in an array state, wherein a signal read-out part for reading out a signal corresponding to the charge stored in each of the plural photoelectric conversion devices is provided.

* * * * *